(12) United States Patent
Bao et al.

(10) Patent No.: US 12,261,095 B2
(45) Date of Patent: *Mar. 25, 2025

(54) SEMICONDUCTOR PACKAGE HAVING AN ENCAPULANT COMPRISING CONDUCTIVE FILLERS AND METHOD OF MANUFACTURE

(71) Applicant: Taiwan Semiconductor Manufacturing Co., Ltd., Hsinchu (TW)

(72) Inventors: Xinyu Bao, Fremont, CA (US); Lee-Chung Lu, Taipei (TW); Jyh Chwen Frank Lee, Palo Alto, CA (US); Fong-Yuan Chang, Hsinchu (TW); Sam Vaziri, San Jose, CA (US); Po-Hsiang Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/499,964

(22) Filed: Nov. 1, 2023

(65) Prior Publication Data

US 2024/0071865 A1    Feb. 29, 2024

Related U.S. Application Data

(63) Continuation of application No. 17/391,258, filed on Aug. 2, 2021, now Pat. No. 11,842,946.

(Continued)

(51) Int. Cl.
*H01L 23/42* (2006.01)
*H01L 21/48* (2006.01)

(Continued)

(52) U.S. Cl.
CPC .......... *H01L 23/42* (2013.01); *H01L 21/4857* (2013.01); *H01L 21/486* (2013.01);
(Continued)

(58) Field of Classification Search
CPC ..... H01L 23/42; H01L 23/295; H01L 23/481; H01L 21/486; H01L 21/6835;
(Continued)

(56) References Cited

U.S. PATENT DOCUMENTS

| | | |
|---|---|---|
| 7,566,955 B2 | 7/2009 | Warner |
| 8,993,380 B2 | 3/2015 | Hou et al. |

(Continued)

FOREIGN PATENT DOCUMENTS

| | | |
|---|---|---|
| CN | 104538393 A | 4/2015 |
| TW | 201714259 A | 4/2017 |

(Continued)

OTHER PUBLICATIONS

Rao, V.S. et al., "Development of High Density Fan Out Wafer Level Package (HD FOWLP) With Multi-Layer Fine Pitch RDL for Mobile Applications," 2016 IEEE 66th Electronic Components and Technology Conference (ECTC), May 31, 2016-Jun. 3, 2016, 8 pages.

(Continued)

*Primary Examiner* — Khiem D Nguyen
(74) *Attorney, Agent, or Firm* — Slater Matsil, LLP

(57) ABSTRACT

Packaged semiconductor devices including high-thermal conductivity molding compounds and methods of forming the same are disclosed. In an embodiment, a semiconductor device includes a first redistribution structure; a first die over and electrically coupled to the first redistribution structure; a first through via over and electrically coupled to the first redistribution structure; an insulation layer extending along the first redistribution structure, the first die, and the first (Continued)

through via; and an encapsulant over the insulation layer, the encapsulant surrounding portions of the first through via and the first die, the encapsulant including conductive fillers at a concentration ranging from 70% to about 95% by volume.

20 Claims, 20 Drawing Sheets

Related U.S. Application Data

(60) Provisional application No. 63/166,350, filed on Mar. 26, 2021.

(51) Int. Cl.
| | |
|---|---|
| *H01L 21/56* | (2006.01) |
| *H01L 23/00* | (2006.01) |
| *H01L 23/29* | (2006.01) |
| *H01L 23/31* | (2006.01) |
| *H01L 23/48* | (2006.01) |
| *H01L 23/498* | (2006.01) |
| *H01L 23/538* | (2006.01) |
| *H01L 25/10* | (2006.01) |

(52) U.S. Cl.
CPC .......... *H01L 21/566* (2013.01); *H01L 23/295* (2013.01); *H01L 23/3128* (2013.01); *H01L 23/481* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/08* (2013.01); *H01L 24/11* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/08237* (2013.01); *H01L 2224/11849* (2013.01); *H01L 2224/16227* (2013.01); *H01L 2224/16237* (2013.01); *H01L 2224/32225* (2013.01); *H01L 2224/48229* (2013.01); *H01L 2224/73204* (2013.01); *H01L 2225/1023* (2013.01); *H01L 2225/1041* (2013.01); *H01L 2225/1058* (2013.01); *H01L 2225/1094* (2013.01); *H01L 2924/1434* (2013.01); *H01L 2924/1811* (2013.01); *H01L 2924/182* (2013.01); *H01L 2924/186* (2013.01); *H01L 2924/351* (2013.01)

(58) Field of Classification Search
CPC ............... H01L 25/105; H01L 23/3128; H01L 23/3185; H01L 23/49838; H01L 23/49816; H01L 23/5383; H01L 24/08; H01L 24/11; H01L 24/19; H01L 24/48
See application file for complete search history.

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,842,798 B2 | 12/2017 | Marimuthu et al. |
| 9,887,134 B2 | 2/2018 | Chang et al. |
| 10,002,811 B2 | 6/2018 | Ko et al. |
| 10,304,791 B2 | 5/2019 | Lee et al. |
| 10,483,197 B2 * | 11/2019 | Jo ............... H01L 25/50 |
| 11,374,136 B2 * | 6/2022 | Tai ............ H01L 31/02002 |
| 11,842,946 B2 * | 12/2023 | Bao ............ H01L 23/5384 |
| 2011/0215470 A1 | 9/2011 | Chen et al. |
| 2013/0075900 A1 | 3/2013 | Shim et al. |
| 2014/0264813 A1 | 9/2014 | Lin et al. |
| 2014/0293529 A1 | 10/2014 | Nair et al. |
| 2015/0206815 A1 * | 7/2015 | Katkar ............ H01L 23/3107 |
| | | 257/738 |
| 2016/0064309 A1 * | 3/2016 | Su ............... H01L 25/50 |
| | | 257/773 |
| 2016/0064342 A1 * | 3/2016 | Chen ............ H01L 24/20 |
| | | 257/774 |
| 2017/0098628 A1 | 4/2017 | Liu et al. |
| 2017/0178984 A1 * | 6/2017 | Ko ................ H01L 21/565 |
| 2018/0096927 A1 | 4/2018 | Kim et al. |
| 2018/0337122 A1 * | 11/2018 | Liao ............ H01L 23/5226 |
| 2018/0350693 A1 | 12/2018 | Huang et al. |
| 2019/0131277 A1 | 5/2019 | Yang et al. |
| 2019/0139896 A1 | 5/2019 | Hsu et al. |
| 2020/0091099 A1 | 3/2020 | Choi et al. |
| 2020/0118985 A1 | 4/2020 | Chae et al. |
| 2020/0243441 A1 | 7/2020 | Hsiao et al. |
| 2021/0296199 A1 | 9/2021 | Costa et al. |

FOREIGN PATENT DOCUMENTS

| | | |
|---|---|---|
| TW | 201724421 A | 7/2017 |
| TW | 201742104 A | 12/2017 |
| TW | 202105635 A | 2/2021 |

OTHER PUBLICATIONS

Xu, R.L. et al., "Thermal Conductivity of Crystalline AlN and the Influence of Atomic-Scale Defects," Journal of Applied Physics, 126, Nov. 2019, 8 pages.

Yeom, Y.S. et al., "Unprecedentedly High Thermal Conductivity of Carbon/Epoxy Composites Derived from Parameter Optimization Studies," Composites Science and Technology, 186 (7), (2020), 107915, Nov. 2019, 10 pages.

* cited by examiner

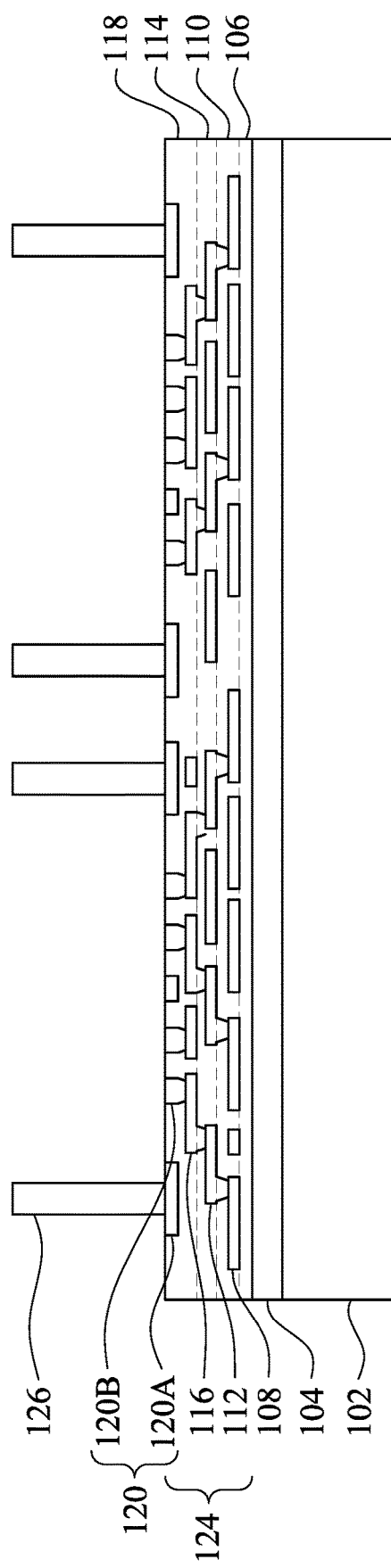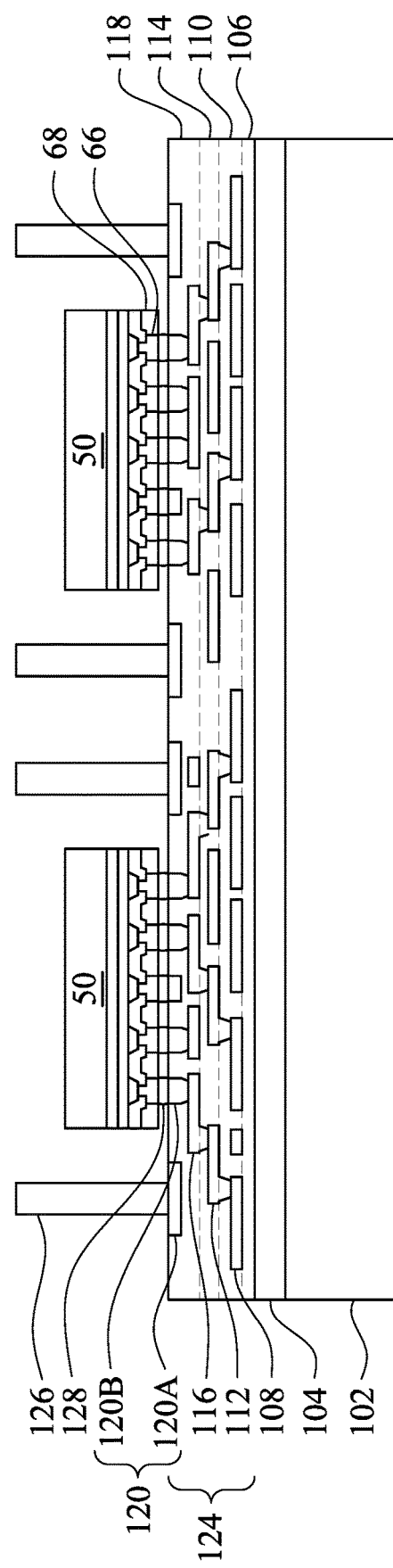

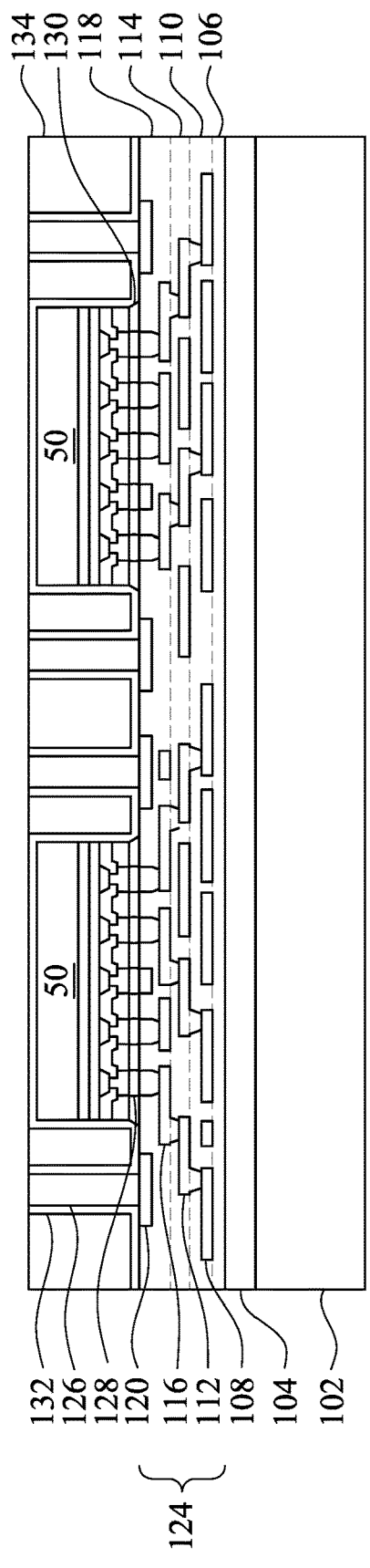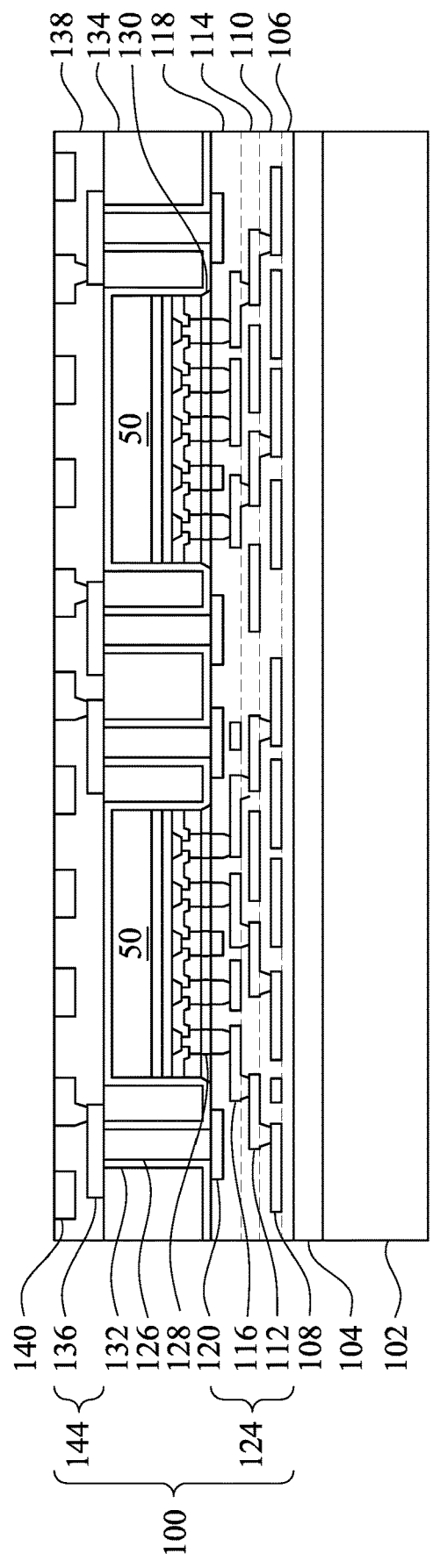

SEMICONDUCTOR PACKAGE HAVING AN ENCAPULANT COMPRISING CONDUCTIVE FILLERS AND METHOD OF MANUFACTURE

CROSS-REFERENCE TO RELATED APPLICATIONS

This application is a continuation of U.S. application Ser. No. 17/391,258, filed on Aug. 2, 2021, issued as U.S. Pat. No. 11,842,946, which claims the benefit of U.S. Provisional Application No. 63/166,350, filed on Mar. 26, 2021, and entitled "Semiconductor Package Structure and Manufacturing Method Thereof," which applications are hereby incorporated herein by reference.

BACKGROUND

The semiconductor industry has experienced rapid growth due to ongoing improvements in the integration density of a variety of electronic components (e.g., transistors, diodes, resistors, capacitors, or the like). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 25 illustrate cross-sectional views of intermediate steps during processes for forming package components, in accordance with some embodiments.

DETAILED DESCRIPTION OF ILLUSTRATIVE EMBODIMENTS

Figure 1:
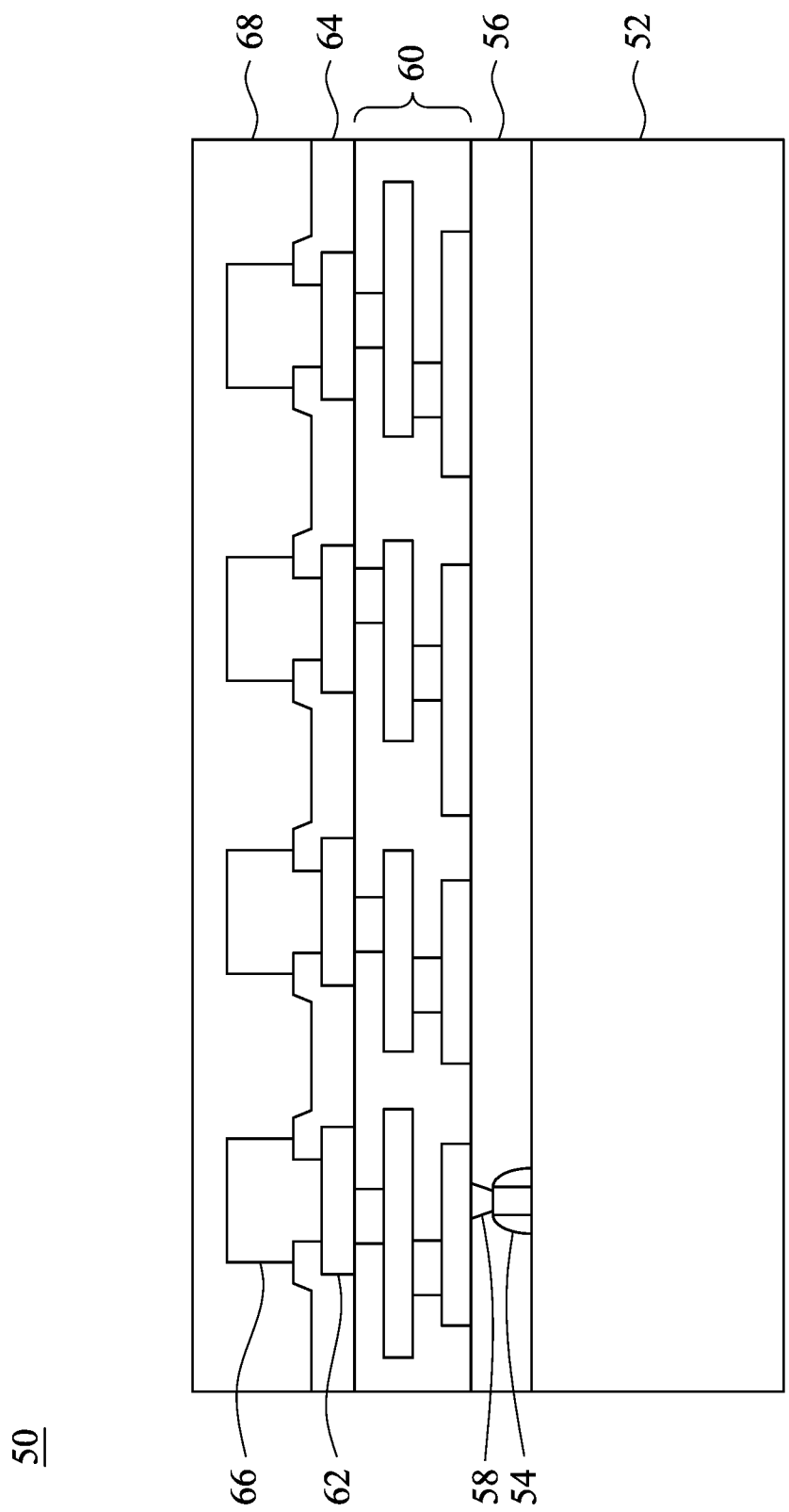

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide packaged semiconductor devices having improved heat dissipation and methods of forming the same. The method includes forming an interconnect structure, forming a via over the interconnect structure, and attaching a semiconductor die to the interconnect structure. An insulation layer is formed over the interconnect structure, the via, and the semiconductor die and a molding compound is formed over the insulation layer. The insulation layer may be electrically insulating and may isolate the via and any exposed conductive features of the interconnect structure and the semiconductor die from one another. This allows electrically conductive materials to be used for the molding compound. The insulation layer may also reduce stress between the molding compound and underlying structures, which allows for materials having higher thermal expansion coefficients to be used for the molding compound. The greater flexibility in the choices of materials for the molding compound allows for materials with higher thermal conductivities to be used for the molding compound. This, in turn, provides better heat dissipation, improves device quality, improves device performance, and reduces device defects.

FIG. 1 illustrates a cross-sectional view of an integrated circuit die 50. The integrated circuit die 50 will be packaged in subsequent processing to form an integrated circuit package. The integrated circuit die 50 may be a logic die (e.g., a central processing unit (CPU), a graphics processing unit (GPU), a system-on-chip (SoC), an application processor (AP), a microcontroller, an application-specific integrated circuit (ASIC) die, or the like), a memory die (e.g., a dynamic random access memory (DRAM) die, a static random access memory (SRAM) die, a high bandwidth memory (HBM) die, or the like), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die), the like, or a combination thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or un-doped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a backside.

Devices 54 (represented by a transistor) may be formed at the active surface of the semiconductor substrate 52. The devices 54 may be active devices (e.g., transistors, diodes, or the like), capacitors, resistors, or the like. An inter-layer dielectric (ILD) 56 is over the active surface of the semiconductor substrate 52. The ILD 56 surrounds and may cover the devices 54. The ILD 56 may include one or more dielectric layers formed of materials such as phosphosilicate glass (PSG), boro-silicate glass (BSG), boron-doped phospho-silicate glass (BPSG), un-doped silicate glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and the pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, phosphosilicate glass (PSG), boro-silicate glass (BSG), boron-doped phosphosilicate glass (BPSG), or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs) (also referred to as through-silicon vias). Each of the semiconductor substrates 52 may (or may not) have an interconnect structure 60.

Figure 2:
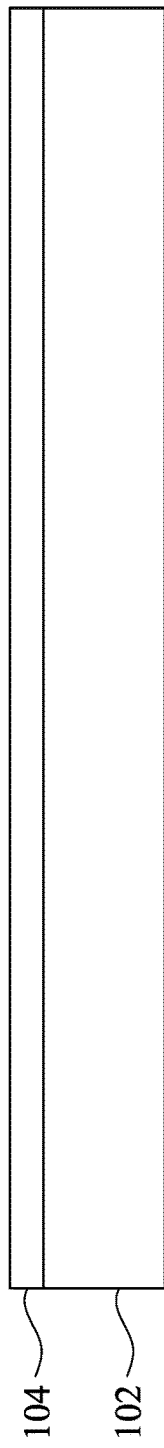

FIGS. 2 through 25 illustrate cross-sectional views of manufacturing an integrated circuit package with improved heat dissipation, in accordance with some embodiments. In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. In some embodiments, one or more of the integrated circuit dies 50 may be packaged to form an integrated circuit package in each of a plurality of package regions over the wafer. The completed integrated circuit packages may also be referred to as integrated fan-out (InFO) packages.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In some embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or the like. The top surface of the release layer 104 may be leveled and may have a high degree of planarity.

Figure 3:
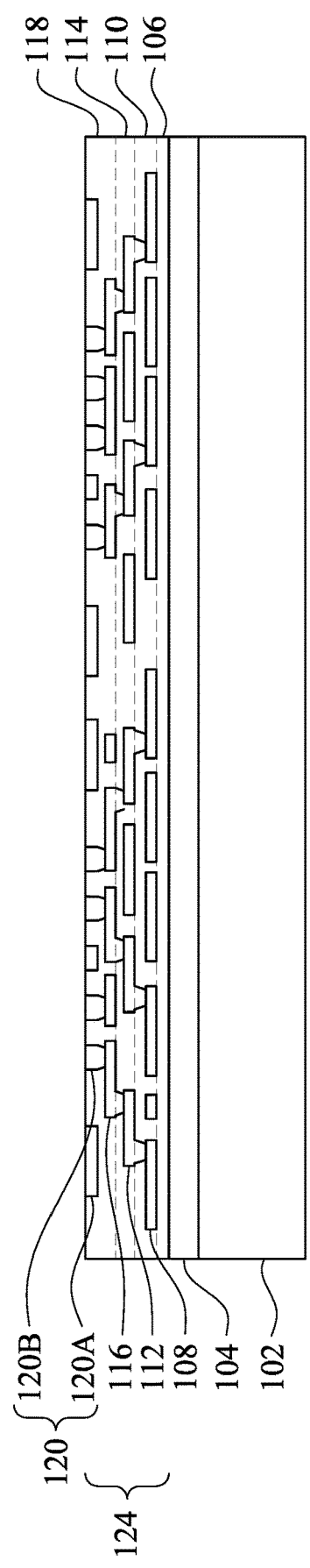

In FIG. 3, a front-side redistribution structure 124 is formed on the release layer 104. The front-side redistribution structure 124 includes dielectric layers 106, 110, 114, and 118; and metallization patterns 108, 112, 116, and 120 (including conductive pads 120A and 120B). The metallization patterns 108, 112, 116, and 120 may also be referred to as redistribution layers or redistribution lines. The front-side redistribution structure 124 illustrated in FIG. 3 includes four dielectric layers and four layers of metallization patterns. More or fewer dielectric layers and metallization patterns may be formed in the front-side redistribution structure 124. If fewer dielectric layers and metallization patterns are to be formed, steps and process discussed below may be omitted. If more dielectric layers and metallization patterns are to be formed, steps and processes discussed below may be repeated.

The front-side redistribution structure 124 may be formed by depositing the dielectric layer 106 on the release layer 104. In some embodiments, the dielectric layer 106 may be formed of a photosensitive material such as PBO, polyimide, BCB, or the like, which may be patterned using a lithography mask. The dielectric layer 106 may be formed by spin coating, lamination, CVD, the like, or a combination thereof.

The metallization pattern 108 is formed on the dielectric layer 106. The metallization pattern 108 may be formed by forming a seed layer (not separately illustrated) over the dielectric layer 106. The seed layer may be a metal layer, which may be a single layer or a composite layer comprising a plurality of sub-layers formed of different materials. In some embodiments, the seed layer comprises a titanium layer and a copper layer over the titanium layer. The seed layer may be deposited by physical vapor deposition (PVD) or the like. A photoresist is formed and patterned on the seed layer. The photoresist may be formed by spin coating or the like and may be exposed to light for patterning. The pattern of the photoresist corresponds to the metallization pattern 108. The patterning forms openings through the photoresist to expose the seed layer. A conductive material is formed in the openings of the photoresist and on the exposed portions of the seed layer. The conductive material may be formed by plating (e.g., electroplating or electroless plating) or the like. The conductive material may comprise a metal, such as copper, titanium, tungsten, aluminum, or the like. The combination of the conductive material and underlying portions of the seed layer form the metallization pattern 108. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed by an acceptable etching process, such as wet or dry etching.

The dielectric layer 110 is deposited on the metallization pattern 108 and the dielectric layer 106. The dielectric layer 110 may be formed of materials and in a manner the same as or similar to the dielectric layer 106. Openings may be patterned through the dielectric layer 110 to expose the underlying metallization pattern 108. The openings may be patterned through the dielectric layer 110 by an acceptable process. In embodiments in which the dielectric layer 110 comprises a photosensitive material, the dielectric layer 110 may be exposed to a patterned energy source (e.g., a patterned light source) and developed to form the openings extending through the dielectric layer 110. In some embodiments, a patterned mask may be formed over the dielectric layer 110 and the dielectric layer 110 may be patterned through the patterned mask using an etching process, such as an anisotropic etch, to form the openings extending through the dielectric layer 110.

The metallization pattern 112 is formed on the dielectric layer 110 and the metallization pattern 108. The metallization pattern 112 includes portions on and extending along a top surface of the dielectric layer 110 (e.g., conductive lines) and portions extending through the dielectric layer 110 (e.g., conductive vias). The portions of the metallization pattern 112 extending through the dielectric layer 110 may be electrically coupled to and physically contact the metallization pattern 108. The metallization pattern 112 may be formed of materials and in a manner the same as or similar to the metallization pattern 108. In some embodiments, the metallization pattern 112 has a different size from the metallization pattern 108. For example, the conductive lines and/or the conductive vias of the metallization pattern 112 may be wider or thicker than the conductive lines of the metallization pattern 108. Further, the metallization pattern 112 may be formed to a greater pitch than the metallization pattern 108.

The dielectric layer 114 is deposited on the metallization pattern 112 and the dielectric layer 110. The dielectric layer 114 may be patterned to expose the metallization pattern 112. The dielectric layer 114 may be formed of materials, and formed and patterned in a manner the same as or similar to the dielectric layer 110.

The metallization pattern 116 is formed on the dielectric layer 114 and the metallization pattern 112. The metallization pattern 116 includes portions on and extending along a top surface of the dielectric layer 114 (e.g., conductive lines) and portions extending through the dielectric layer 114 (e.g., conductive vias). The portions of the metallization pattern 116 extending through the dielectric layer 114 may be electrically coupled to and physically contact the metallization pattern 112. The metallization pattern 116 may be formed of materials and in a manner the same as or similar to the metallization pattern 108. In some embodiments, the metallization pattern 116 has a different size from the metallization pattern 108 and the metallization pattern 112. For example, the conductive lines and/or the conductive vias of the metallization pattern 116 may be wider or thicker than the conductive lines and/or the conductive vias of the metallization pattern 108 and the metallization pattern 112. Further, the metallization pattern 116 may be formed to a greater pitch than the metallization pattern 108 and the metallization pattern 112.

The dielectric layer 118 is deposited on the metallization pattern 116 and the dielectric layer 114. The dielectric layer 118 may be patterned to form openings exposing the metallization pattern 116. The dielectric layer 118 may be formed of materials, and formed and patterned in a manner the same as or similar to the dielectric layer 110.

The metallization pattern 120 is formed in the openings extending through the dielectric layer 118. In some embodiments, the metallization pattern 120 may be formed on the dielectric layer 118 and the metallization pattern 116. The metallization pattern 120 may be formed of materials and in a manner the same as or similar to the metallization pattern 108. After the metallization pattern 120 is formed, a planarization process may be performed on the metallization pattern 120 to level top surfaces of the metallization pattern 120 with top surfaces of the dielectric layer 118. The planarization process may be a chemical-mechanical polish (CMP), a grinding process, or the like. The metallization pattern 120 may include conductive pads 120A, on which vias (such as the vias 126, discussed below with respect to FIG. 4) may be subsequently formed, and conductive pads 120B, to which conductive connectors (such as the conductive connectors 128, discussed below with respect to FIG. 5) may be subsequently bonded.

In FIG. 4, vias 126 (also referred to as through-mold interconnects (TMIs)) are formed on the conductive pads 120A of the metallization pattern 120. The vias 126 may extend away from the topmost dielectric layer of the front-side redistribution structure 124 (e.g., the dielectric layer 118). As an example to form the vias 126, a seed layer (not separately illustrated) is formed over the front-side redistribution structure 124, e.g., on the dielectric layer 118 and the metallization pattern 120. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, physical vapor deposition (PVD) or the like. In some embodiments, such as embodiments where the vias 126 are the same width as or narrower than the underlying conductive pads 120A, a separate seed layer may be omitted, and the conductive pads 120A may act as the seed layer.

A photoresist is formed and patterned on the seed layer (if present) and the front-side redistribution structure 124. The photoresist may be formed by spin coating or the like and may be exposed to light for patterning. The pattern of the photoresist corresponds to vias 126. The patterning forms openings through the photoresist to expose the seed layer or the conductive pads 120A. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer (if present) are removed using an acceptable etching process, such as wet or dry etching. The remaining portions of the seed layer and the conductive material form the vias 126.

In some embodiments, wire bond structures may be used in place of the vias 126. For example, a wire bond structure (not separately illustrated) may be formed on each of the conductive pads 120A. Each of the wire bond structures may include a bond ball formed on the respective conductive pad 120A and a metal wire attached to the respective bond ball.

In FIG. 5, two integrated circuit dies 50 are bonded in the illustrated package region. Although FIG. 5 illustrates two integrated circuit dies 50 bonded in the illustrated package region, any number of the integrated circuit dies 50 may be bonded in each of a plurality of package regions on a wafer. In FIG. 5, the integrated circuit dies 50 are disposed face down such that the front sides of the integrated circuit dies 50 face the conductive pads 120B, and the back sides of the integrated circuit dies 50 face away from the conductive pads 120B. The integrated circuit dies 50 are bonded to the conductive pads 120B through conductive connectors 128. The conductive connectors 128 are formed over the conductive pads 120B. The conductive connectors 128 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 128 may include a conductive material such as solder, copper, aluminum, gold, nickel, silver, palladium, tin, the like, or a combination thereof. In some embodiments, the conductive connectors 128 are formed by initially forming a layer of solder through evaporation, electroplating, printing, solder transfer, ball placement, or the like. Once the layer of solder has been formed, a reflow may be performed in order to shape the material into the desired bump shapes. In some embodiments, the conductive connectors 128 comprise metal pillars (such as copper pillars), which may be formed by sputtering, printing, electroplating, electroless plating, CVD, or the like. The metal pillars may be solder-free and have vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof. The metal cap layer may be formed by a plating process.

Figure 6:
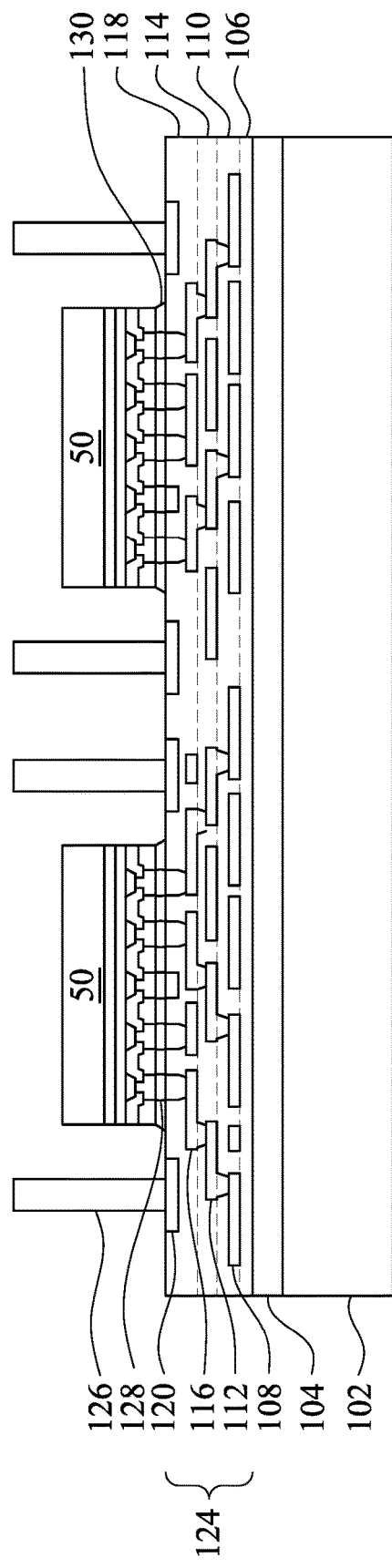

In FIG. 6, an underfill 130 is formed between the integrated circuit dies 50 and the front-side redistribution structure 124. The underfill 130 may surround the conductive connectors 128. The underfill 130 may be formed by a capillary flow process after the integrated circuit dies 50 are attached, or may be formed by a suitable deposition method before the integrated circuit dies 50 are attached. In some embodiments, the underfill 130 may be formed of a polymer material, and may increase the bonding strength of the integrated circuit dies 50 to the front-side redistribution structure 124.

Figure 7:
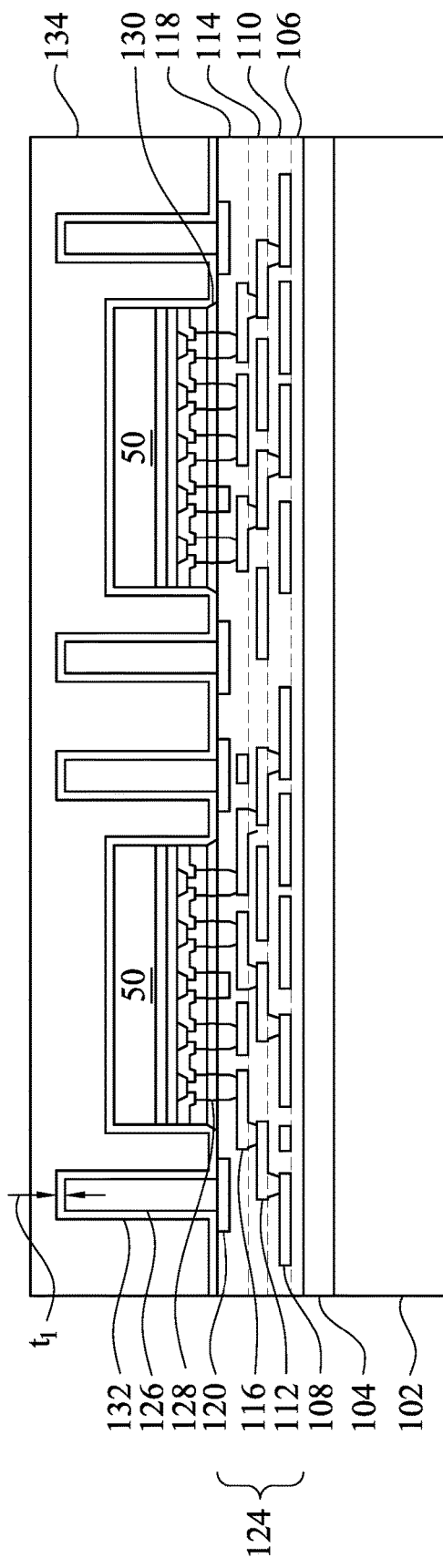

In FIG. 7, an insulation layer 132 is formed over the vias 126, the integrated circuit dies 50, the underfill 130, and the front-side redistribution structure 124, and an encapsulant 134 is formed over the insulation layer 132. The insulation layer 132 may be a conformal layer. In some embodiments, the insulation layer 132 may be deposited by CVD, plasma-enhanced CVD (PECVD), atomic layer deposition (ALD), plasma-enhanced ALD (PEALD), PVD, sputtering, spin coating, thermal spraying, or the like. The insulation layer 132 may be formed of an electrically insulating material. In some embodiments, the insulation layer 132 may be formed of a material having a high thermal conductivity, such as a thermal conductivity greater than about 10 W/m·K. In the embodiments in which the insulation layer 132 is formed of a high-thermal conductivity material, the insulation layer 132 may comprise aluminum nitride (AlN), boron nitride (BN), beryllium oxide (BeO), diamond, aluminum oxide ($Al_2O_3$), magnesium oxide (MgO), combinations or multiple layers thereof, or the like. In some embodiments, the insulation layer 132 may be formed of a material having a relatively low thermal conductivity, such as a thermal conductivity of less than about 10 W/m·K, a thermal conductivity ranging from about 1 W/m·K to about 10 W/m·K, or the like. In the embodiments in which the insulation layer 132 is formed of a relatively low-thermal conductivity material, the insulation layer 132 may comprise silicon oxide ($SiO_2$), silicon nitride ($SiN_x$), silicon oxynitride ($SiON_x$), combinations or multiple layers thereof, or the like. In some embodiments, the insulation layer 132 may comprise a polymer material. The insulation layer 132 may have a thermal conductivity ranging from about 1 W/m·K to about 100 W/m·K, an electrical conductivity ranging from about ranging from about $10^7$ Ω·cm to about $10^{14}$ Ω·cm, and a coefficient of thermal expansion (CTE) ranging from about 0.1 ppm/° C. to about 10 ppm/° C.

The encapsulant 134 is then formed over the insulation layer 132. The encapsulant 134 may be a molding compound, an epoxy, or the like. In some embodiments, the encapsulant 134 may include a mixture of epichlorohydrin with any of bisphenol-A (BPA), bisphenol A diglycidyl ether (DGEBA), bisphenol-F (BPF), phenols, thiols, anhydrides, amines, aliphatic alcohols, fillers, combinations thereof, or the like. The encapsulant 134 may be applied by compression molding, transfer molding, or the like, and may be formed such that the through vias 126 and/or the integrated circuit dies 50 are buried or covered. The encapsulant 134 may be applied in a liquid or semi-liquid form and subsequently cured.

The encapsulant 134 may be formed of high-thermal conductivity materials, which improves heat dissipation through the encapsulant 134. For example, in some embodiments, the encapsulant 134 may be formed of a mix of epoxy and conductive fillers, which may comprise graphite, graphene, carbon nanotubes, conductive particles (e.g., copper (Cu), silicon (Si), silver (Ag), gold (Au), iron (Fe), tungsten (W), combinations thereof, or the like), combinations thereof, or the like. In some embodiments, the graphite fillers may include flakes having a size less than 1 µm. The graphene fillers may be single-layer or multi-layer and may include flakes having a size less than 10 µm. The carbon nanotube fillers may be single-wall or multi-wall and may include sizes less than 50 µm. The conductive fillers may have a thermal conductivity ranging from about 10 W/m·K to about 1,000 W/m·K, an electrical conductivity ranging from about ranging from about $10^{-3}$ Ω·cm to about $10^{14}$ Ω·cm, and a coefficient of thermal expansion (CTE) ranging from about 1 ppm/° C. to about 10 ppm/° C. The encapsulant 134 may include the conductive fillers at a concentration ranging from about 5% to about 95% by volume. In some embodiments, the encapsulant 134 may include the conductive fillers at a concentration ranging from about 70% to about 95% by volume, a concentration ranging from about 5% to about 40% by volume, or a concentration ranging from about 30% to about 70% by volume. Including the conductive fillers in the prescribed ranges of concentrations may improve heat dissipation through the encapsulant 134. In some embodiments, the encapsulant 134 may further include non-conductive fillers, such as AlN, diamond, BN, BeO, magnesium oxide (MgO), $Al_2O_3$, $SiO_2$, silicon (Si), silicon nitride ($SiN_x$), combinations thereof, or the like.

The encapsulant 134 may have a thermal conductivity greater than the thermal conductivity of the insulation layer 132. In some embodiments, the encapsulant 134 may have a thermal conductivity of greater than about 40 W/m·K; a thermal conductivity ranging from about 40 W/m·K to about 100 W/m·K, from about 5 W/m·K to about 200 W/m·K, or from about 100 W/m·K to about 200 W/m·K; or the like. The encapsulant 134 may have an electrical conductivity ranging from about ranging from about $10^{-3}$ Ω·cm to about $10^{14}$ Ω·cm and a coefficient of thermal expansion (CTE) ranging from about 0.1 ppm/° C. to about 20 ppm/° C.

Forming the insulation layer 132 over the vias 126, the integrated circuit dies 50, and the front-side redistribution structure 124 allows for greater flexibility in the choice of materials for the encapsulant 134. For example, providing the insulation layer 132 formed of an electrically insulating material prevents shorts between the vias 126, the integrated circuit dies 50, and the front-side redistribution structure 124, even when the encapsulant 134 is formed of an electrically conductive material. The insulation layer 132 provides a buffer layer between the encapsulant 134 and each of the vias 126, the integrated circuit dies 50, and the front-side redistribution structure 124, which reduces stress. This allows for the encapsulant 134 to be formed of materials having higher thermal expansion coefficients. The greater flexibility in the choice of materials for the encapsulant 134 allows for materials having high thermal conductivities to be used for the encapsulant 134, which improves heat dissipation from the integrated circuit dies 50. This improves device performance and reduces device defects.

The insulation layer 132 may have a thickness t, ranging from about 10 nm to about 100 nm. Forming the insulation layer 132 to a thickness less than the prescribed range may cause difficulties in the formation of the insulation layer 132 and may be insufficient for providing the benefits of the insulation layer 132 (e.g., providing electrical isolation between the vias 126, the integrated circuit dies 50, and the front-side redistribution structure 124 and providing a buffer layer between the encapsulant 134 and the underlying structures). Further, the insulation layer 132 may be formed of a material having a lower thermal conductivity than the material of the encapsulant 134. Forming the insulation layer 132 to a thickness greater than the prescribed range lowers the combined thermal conductivity of the insulation layer 132 and the encapsulant 134.

In FIG. 8, a planarization process is performed on the encapsulant 134 and the insulation layer 132. As illustrated in FIG. 9, the planarization process may expose the vias 126. The vias 126 pass through the insulation layer 132 and the encapsulant 134, and may be subsequently referred to as through vias 126. In some embodiments, at least a portion of the insulation layer 132 may remain on back sides of the integrated circuit dies 50. In some embodiments, portions of the encapsulant 134 may also remain over the back sides of the integrated circuit dies 50, or the encapsulant 134 and the insulation layer 132 may be planarized such that the back sides of the integrated circuit dies 50 are exposed. The planarization process may also remove material of the through vias 126. Top surfaces of the through vias 126, the insulation layer 132, and the encapsulant 134 may be level with one another following the planarization process (e.g., within process variations). In some embodiments, the planarization process may be a CMP, a grinding process, or the like.

In FIG. 9, a backside redistribution structure 144 is formed on the encapsulant 134, the through vias 126, and the insulation layer 132. The backside redistribution structure 144 includes a dielectric layer 138 and metallization patterns 136 and 140. The metallization patterns 136 and 140 may also be referred to as redistribution layers or redistribution lines. The backside redistribution structure 144 illustrated in FIG. 9 includes one dielectric layer and two layers of metallization patterns. More or fewer dielectric layers and metallization patterns may be formed in the backside redistribution structure 144. If fewer dielectric layers and metallization patterns are to be formed, steps and process discussed below may be omitted. If more dielectric layers and metallization patterns are to be formed, steps and processes discussed below may be repeated.

The backside redistribution structure 144 may be formed by forming the metallization pattern 136 on the encapsulant 134, the insulation layer 132, and the through vias 126. The metallization pattern 136 may be formed of materials and in a manner the same as or similar to the metallization pattern 108. After the metallization pattern 136 is formed and patterned, the metallization pattern 136 may include portions extending along top surfaces of the encapsulant 134, the insulation layer 132, and the through vias 126. The metallization pattern 136 may be electrically coupled the through vias 126.

The dielectric layer 138 is deposited on the metallization pattern 136, the encapsulant 134, the insulation layer 132, and the through vias 126. The dielectric layer 138 may be formed of materials and in a manner the same as or similar to the dielectric layer 106. Openings may be patterned through the dielectric layer 138 to expose the underlying metallization pattern 136. The openings may be patterned through the dielectric layer 138 by an acceptable process. In embodiments in which the dielectric layer 138 comprises a photosensitive material, the dielectric layer 138 may be exposed to a patterned energy source (e.g., a patterned light source) and developed to form the openings extending through the dielectric layer 138. In some embodiments, a patterned mask may be formed over the dielectric layer 138 and the dielectric layer 138 may be patterned through the patterned mask using an etching process, such as an anisotropic etch, to form the openings extending through the dielectric layer 138.

The metallization pattern 140 is formed in the openings extending through the dielectric layer 138. In some embodiments, the metallization pattern 140 may be formed on the dielectric layer 138 and the metallization pattern 136. The metallization pattern 120 may be formed of materials and in a manner the same as or similar to the metallization pattern 108. After the metallization pattern 140 is formed, a planarization process may be performed on the metallization pattern 140 to level top surfaces of the metallization pattern 140 with top surfaces of the dielectric layer 138. The planarization process may be a CMP, a grinding process, or the like.

Thus, a first package component 100 is formed in the illustrated package region. The first package component 100 includes the integrated circuit dies 50, the encapsulant 134, the insulation layer 132, the through vias 126, the front-side redistribution structure 124, and the backside redistribution structure 144.

Figure 10:
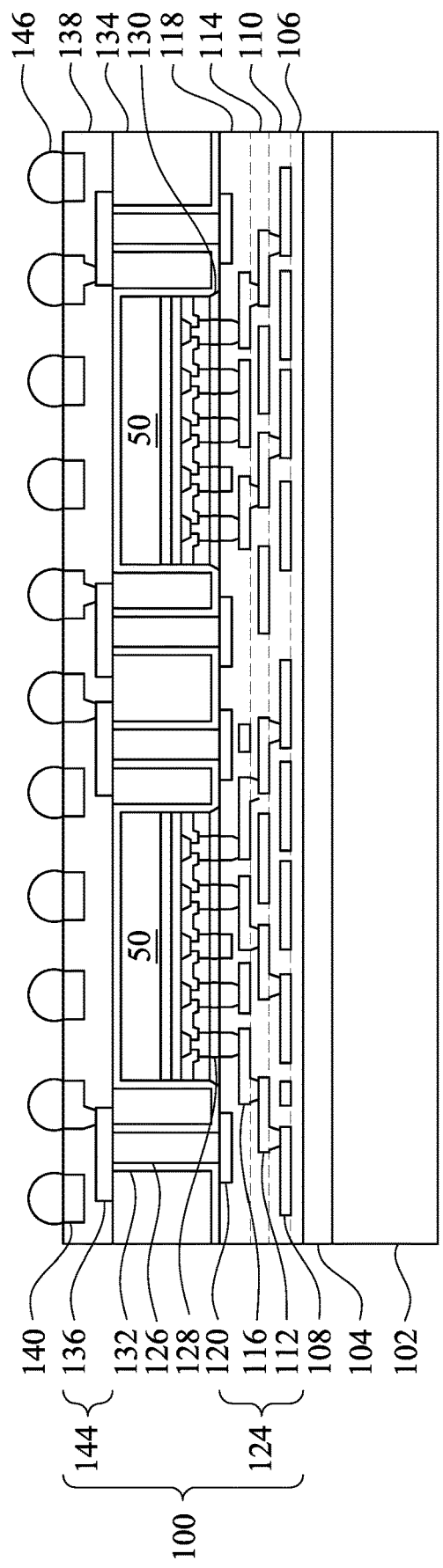

In FIG. 10, conductive connectors 146 are formed over the metallization pattern 140. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once the layer of solder has been formed, a reflow may be performed in order to shape the material into the desired bump shapes. In some embodiments, the conductive connectors 146 comprise metal pillars (such as copper pillars), which may be formed by sputtering, printing, electroplating, electroless plating, CVD, or the like. The metal pillars may be solder free and have vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof. The metal cap layer may be formed by a plating process.

Figure 11:
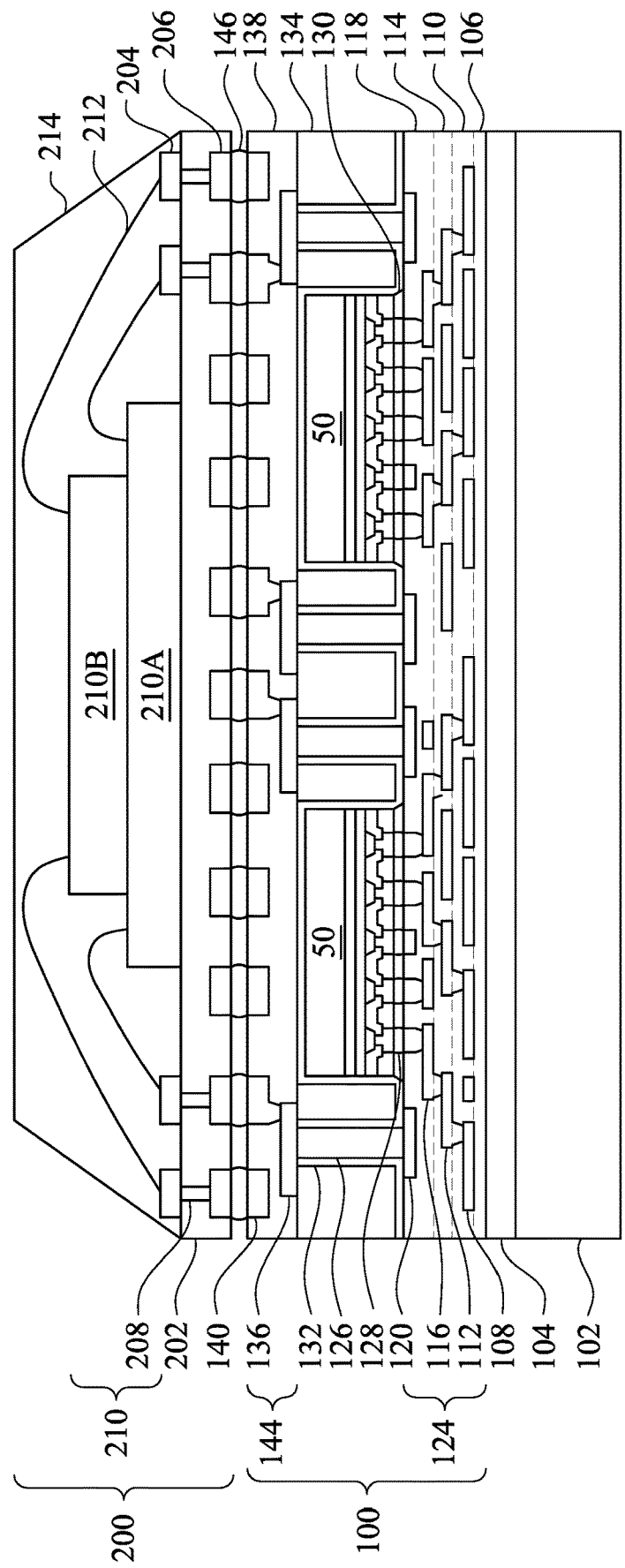

In FIG. 11, a second package component 200 is coupled to the conductive connectors 146. The second package component 200 is coupled to the first package component wo to form an integrated circuit device stack in the illustrated package region. The second package component 200 includes a substrate 202 and one or more stacked dies 210 (e.g., a first stacked die 210A and a second stacked die 210B) coupled to the substrate 202. Although one set of stacked dies 210 (e.g., the first stacked die 210A and the second stacked die 210B) is illustrated, in some embodiments, multiple sets of stacked dies 210 (each including one or more stacked dies) may be disposed side-by-side and coupled to a surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may be used. The substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 202 may be based on an insulating core, such as a fiberglass-reinforced resin core. The core material may be a fiberglass resin, such as FR4. In some embodiments, the core material may include bismaleimide-triazine (BT) resin, other printed circuit board (PCB) materials or films, or the like. Build-up films, such as Ajinomoto build-up film (ABF) or other laminates, may be used for the substrate 202.

The substrate 202 may include active and passive devices (not separately illustrated). A wide variety of devices, such as transistors, capacitors, resistors, combinations of these, and the like, may be used to generate the structural and functional requirements of the design for the second package component 200. The devices may be formed using any suitable methods.

The substrate 202 may also include metallization layers (not separately illustrated) and conductive vias 208. The metallization layers may be formed over the active and passive devices and are designed to connect the various devices to form functional circuitry. The metallization layers may be formed of alternating layers of dielectric materials (e.g., low-k dielectric materials) and conductive materials (e.g., copper) with vias interconnecting the layers of conductive materials. The metallization layers may be formed through any suitable process (such as deposition, damascene, dual damascene, or the like). In some embodiments, the substrate 202 is substantially free of active and passive devices.

The substrate 202 may include bond pads 204 on a first side of the substrate 202 and bond pads 206 on a second side of the substrate 202 opposite the first side. The bond pads 204 may be used to couple to the stacked dies 210 and the bond pads 206 may be used to couple to the conductive connectors 146. In some embodiments, such as the embodiment illustrated by the bond pads 206, the bond pads 204 and the bond pads 206 are formed by forming recesses (not separately illustrated) into dielectric layers (not separately illustrated) on the first and second sides of the substrate 202. The recesses may be formed to allow the bond pads 204 and the bond pads 206 to be embedded into the dielectric layers. In other embodiments, such as the embodiment illustrated by the bond pads 204, the recesses are omitted as the bond pads 204 and the bond pads 206 may be formed on the dielectric layers. In some embodiments, the bond pads 204 and the bond pads 206 include a thin seed layer (not separately illustrated) made of copper, titanium, nickel, gold, palladium, the like, or a combination thereof. The conductive material of the bond pads 204 and the bond pads 206 may be deposited over the thin seed layer. The conductive material may be formed by an electro-chemical plating process, an electroless plating process, CVD, ALD, PVD, the like, or a combination thereof. In some embodiments, the conductive material of the bond pads 204 and the bond pads 206 is copper, tungsten, aluminum, silver, gold, the like, or a combination thereof.

In some embodiments, the bond pads 204 and the bond pads 206 are UBMs, which include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be used for the bond pads 204 and the bond pads 206. Any suitable materials or layers of material that may be used for the bond pads 204 and the bond pads 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In some embodiments, the stacked dies 210 are stacked memory dies. For example, the stacked dies 210 may be memory dies, such as low-power (LP) double data rate (DDR) memory modules (e.g., LPDDR1, LPDDR2, LPDDR3, LPDDR4), DRAM dies, combinations thereof, or the like.

The stacked dies 210 and the wire bonds 212 may be encapsulated by a molding material 214. In some embodiment, the molding material 214 may be molded on the stacked dies 210 and the wire bonds 212 using compression molding. In some embodiments, the molding material 214 is a molding compound, a polymer, an epoxy, a silicon oxide material, the like, or a combination thereof. A curing process may be performed to cure the molding material 214. The curing process may be a thermal curing, a UV curing, the like, or a combination thereof. In some embodiments, the stacked dies 210 and the wire bonds 212 are buried in the molding material 214. After the curing of the molding material 214, a planarization step, such as a grinding, is performed to remove excess portions of the molding material 214 and provide a planar surface for the second package component 200.

After the second package component 200 is formed, the second package component 200 may be bonded to the first package component 100 by way of the conductive connectors 146, the bond pads 206, and the metallization pattern 140. In some embodiments, the stacked dies 210 may be coupled to the integrated circuit dies 50 through the wire bonds 212, the bond pads 204, the conductive vias 208, the bond pads 206, the conductive connectors 146, the backside redistribution structure 144, the through vias 126, and the front-side redistribution structure 124.

In some embodiments, a solder resist (not separately illustrated) is formed on the second side of the substrate 202. The conductive connectors 146 may be disposed in openings in the solder resist to be electrically and mechanically coupled to conductive features (e.g., the bond pads 206) in the substrate 202. The solder resist may be used to protect areas of the substrate 202 from external damage. In some embodiments, the conductive connectors 146 have an epoxy flux (not separately illustrated) formed thereon before they are reflowed with at least some of the epoxy portion of the epoxy flux remaining after the second package component 200 is attached to the first package component 100.

Figure 12:
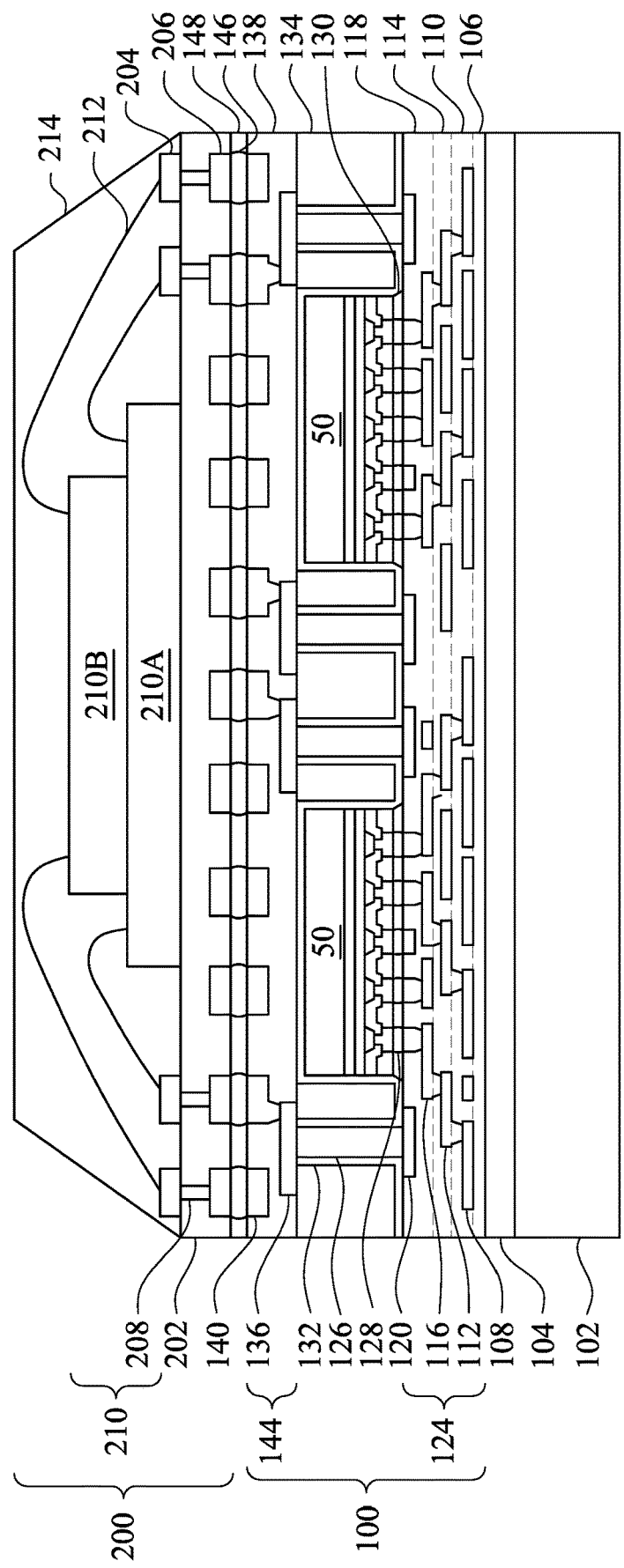

In FIG. 12, an encapsulant 148 is formed between the first package component 100 and the second package components 200, surrounding the conductive connectors 146. In some embodiments (not separately illustrated), the encapsulant 148 may further be formed around the second package component 200, and the encapsulant 148 may be formed around the first package component 100. The encapsulant 148 may be a molding compound, epoxy, a molding underfill, or the like. The encapsulant 148 may be applied by compression molding, transfer molding, or the like. The encapsulant 148 is further formed in gap regions between the second package component 200 and the underlying first package component 100. The encapsulant 148 may be applied in liquid or semi-liquid form and subsequently cured.

Figure 13:
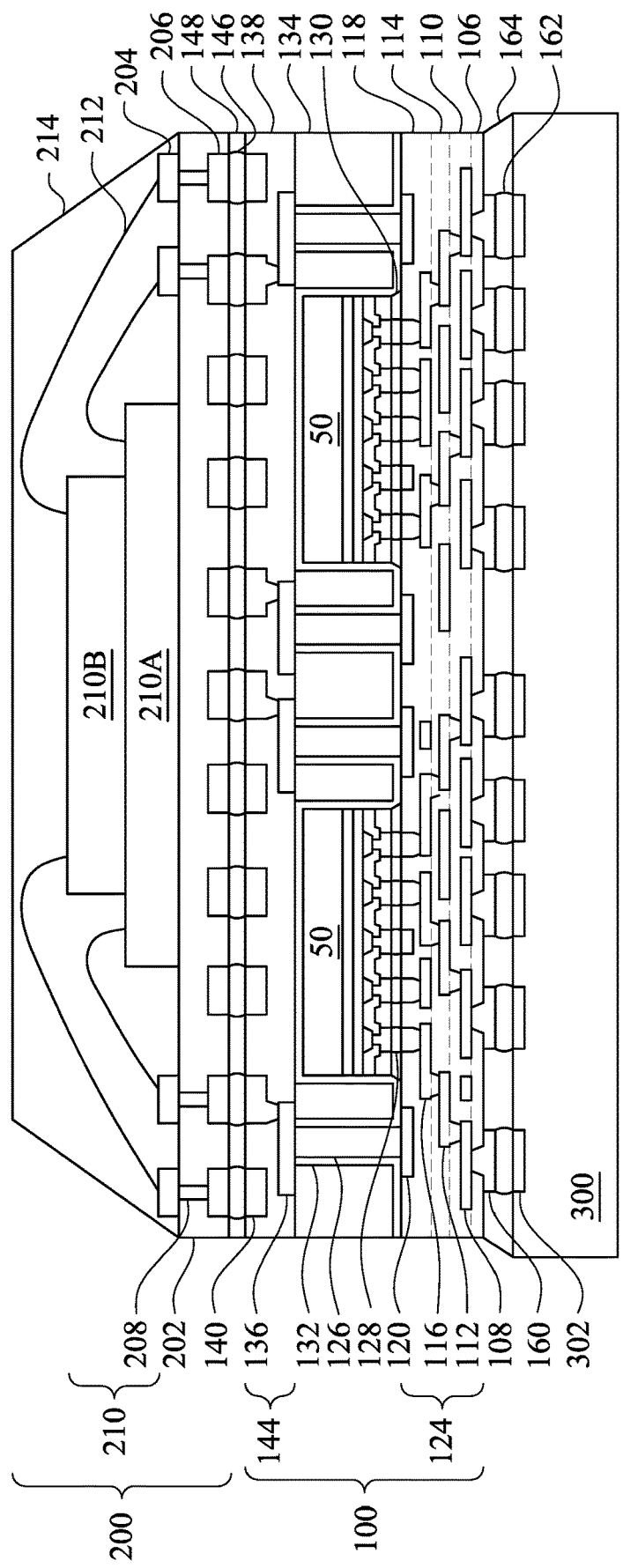

In FIG. 13, a carrier substrate de-bonding is performed to detach (or "de-bond") the carrier substrate 102 from the first package component 100 (e.g., the dielectric layer 106). In some embodiments, the de-bonding includes projecting a light, such as a laser light or a UV light, on the release layer 104 so that the release layer 104 decomposes under the heat of the light and the carrier substrate 102 can be removed. A major surface of the dielectric layer 106 may be exposed after removing the carrier substrate 102 and the release layer 104.

After the carrier substrate 102 and the release layer 104 are removed, UBMs 160 and conductive connectors 162 are formed for external connection to the front-side redistribution structure 124. The UBMs 160 include bump portions on and extending along the major surface of the dielectric layer 106, and via portions extending through the dielectric layer 106. The via portions of the UBMs 160 may be electrically coupled to and physically contact the metallization patterns 108. As a result, the UBMs 160 are electrically coupled to the through vias 126 and the integrated circuit dies 50 through the front-side redistribution structure 124. The UBMs 160 may be formed of materials and in a manner the same as or similar to the metallization pattern 108.

Conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 may include a conductive material, such as solder, copper, aluminum, gold, nickel, silver, palladium, tin, the like, or a combination thereof. In some embodiments, the conductive connectors 162 are formed by initially forming a layer of solder through evaporation, electroplating, printing, solder transfer, ball placement, or the like. Once the layer of solder has been formed on the structure, a reflow may be performed in order to shape the material into the desired bump shapes. In some embodiments, the conductive connectors 162 comprise metal pillars (such as copper pillars), which may be formed by sputtering, printing, electro plating, electroless plating, CVD, or the like. The metal pillars may be solder free and have vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof. The metal cap layer may be formed by a plating process.

Further in FIG. 13, the first package component 100 is mounted to a substrate 300. The substrate 300 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 300 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 300 may be based on an insulating core such as a fiberglass reinforced resin core. In some embodiments, the core material may be a fiberglass resin such as FR4. In some embodiments, the core material may include bismaleimide-triazine (BT) resin, other printed circuit board (PCB) materials, or other films. Build up films such as Ajinomoto build-up film (ABF) or other laminates may be used for the substrate 300.

The substrate 300 may include active and passive devices (not separately illustrated). A wide variety of devices such as transistors, capacitors, resistors, combinations of these, and the like may be included. The devices may be formed using any suitable methods. The substrate 300 may also include metallization layers (not separately illustrated). The metallization layers may be formed over the active and passive devices and are designed to connect the various devices to form functional circuitry. The metallization layers may be formed of alternating layers of dielectric materials (e.g., low-k dielectric materials) and conductive materials (e.g., copper) with vias interconnecting the layers of conductive materials. The metallization layers may be formed through any suitable processes (such as deposition, damascene, dual damascene, or the like). In some embodiments, the substrate 300 is substantially free of active and passive devices.

The substrate 300 may include bond pads 302 formed on a first side of the substrate 300 facing the first package component 100. In some embodiments, the bond pads 302 may be formed by forming recesses (not separately illustrated) into dielectric layers (not separately illustrated) on the first side of the substrate 300. The recesses may be formed to allow the bond pads 302 to be embedded into the dielectric layers. In some embodiments, the recesses are omitted and the bond pads 302 may be formed on the dielectric layers. In some embodiments, the bond pads 302 include a thin seed layer (not separately illustrated) made of copper, titanium, nickel, gold, palladium, the like, or a combination thereof. The conductive materials of the bond pads 302 may be deposited over the thin seed layer. The conductive materials may be formed by an electro-chemical plating process, an electroless plating process, CVD, ALD, PVD, the like, or a combination thereof. In an embodiment, the conductive materials of the bond pads 302 include copper, tungsten, aluminum, silver, gold, the like, or a combination thereof.

In some embodiments, the bond pads 302 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 302. Any suitable materials or layers of materials that may be used for the bond pads 302 are fully intended to be included within the scope of the current application.

The substrate 300 is electrically coupled and physically attached to the first package component wo by way of the bond pads 302, the conductive connectors 162, and the UBMs 160. The substrate 300 may be placed over the first package component 100 and a reflow process may be performed to reflow the conductive connectors 162 and bond the bond pads 302 to the UBMs 160 through the conductive connectors 162.

An underfill 164 may then be formed between the first package component 100 and the substrate 300, surrounding the bond pads 302, the UBMs 160, and the conductive connectors 162. The underfill 164 may reduce stress and protect the joints resulting from the reflowing of the conductive connectors 162. The underfill 164 may be formed by a capillary flow process after the first package component 100 is attached to the substrate 300, or may be formed by a suitable deposition method before the first package component 100 is attached.

Including the insulation layer 132 disposed between the encapsulant 134 and each of the through vias 126, the integrated circuit dies 50, and the metallization pattern 120 allows for a greater variety of materials to be used for the encapsulant 134. For example, the insulation layer 132 provides electrical isolation, such that electrically conductive materials may be used for the encapsulant 134. Further, the insulation layer 132 may provide a physical buffer layer, such that materials having high thermal expansion coefficients may be used for the encapsulant 134. This allows for materials having high thermal conductivity to be used for the encapsulant 134, which increases heat dissipation through the encapsulant 134. This improves device performance and reduces device defects.

Figure 14:
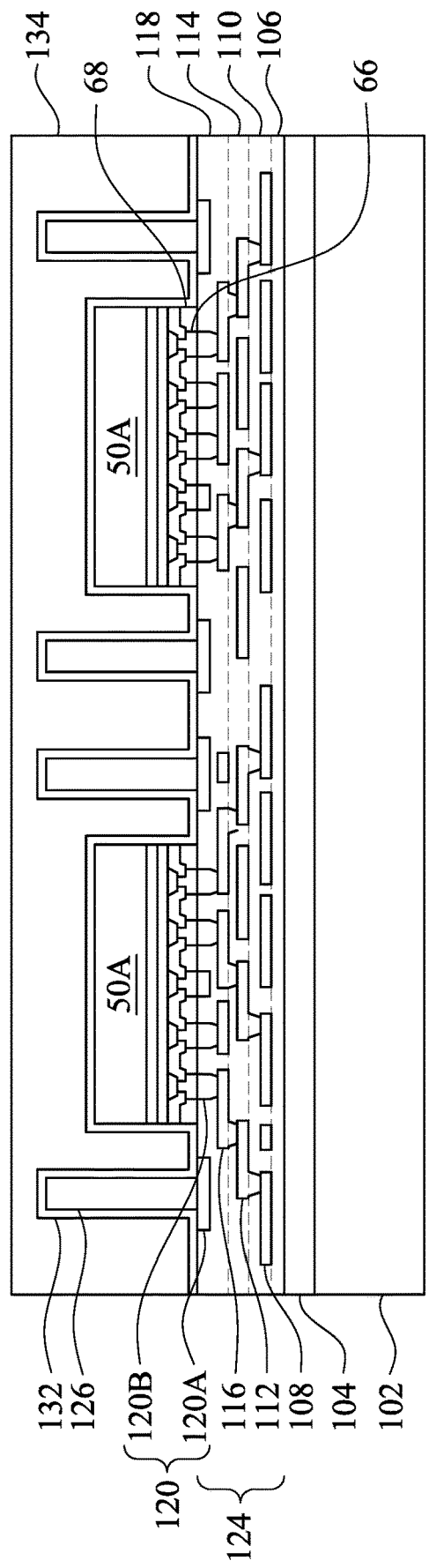
Figure 15:
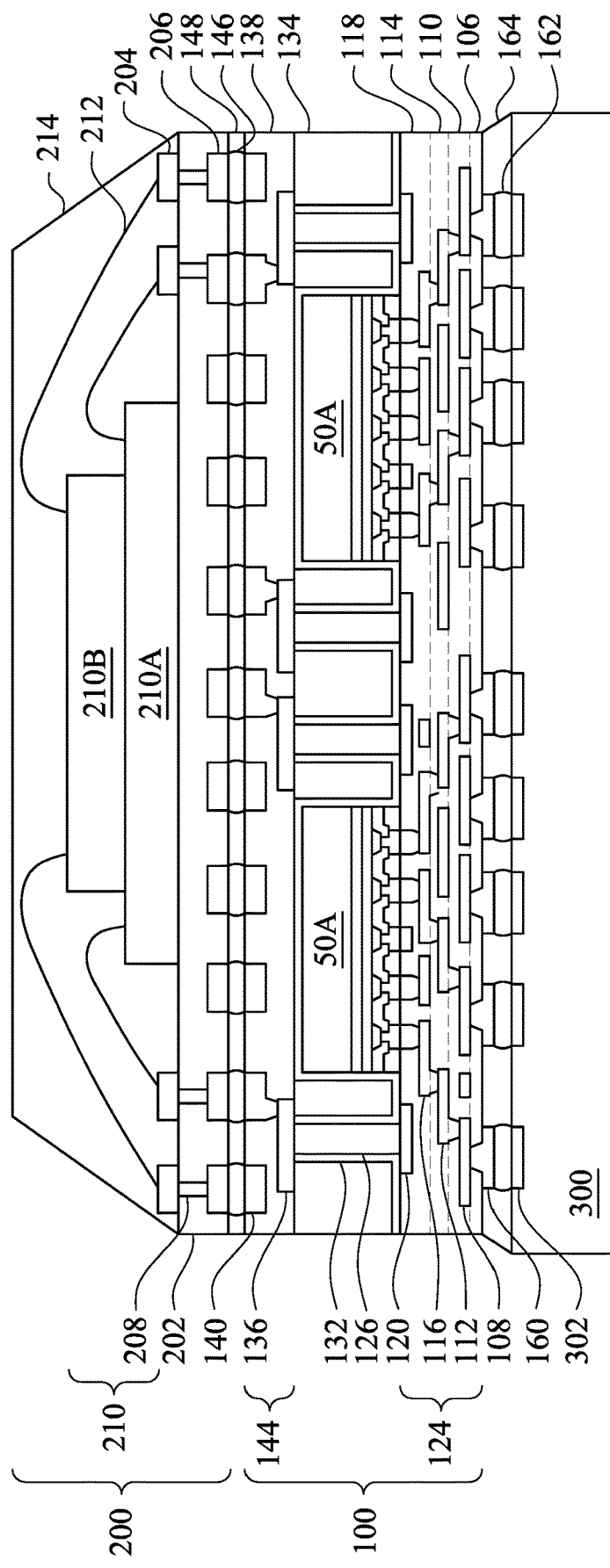

FIGS. 14 and 15 illustrate an embodiment in which integrated circuit dies 50A are directly bonded to the front-side redistribution structure 124 (without the conductive connectors 128 and the underfill 130 disposed there between). In FIG. 14 the integrated circuit dies 50A are bonded to the front-side redistribution structure 124 illustrated in FIG. 4 and an insulation layer 132 and an encapsulant 134 are formed over the resulting structure. The integrated circuit dies 50A may be the same as or similar to the integrated circuit dies 50, discussed above. The integrated circuit dies 50A are disposed face down such that front sides of the integrated circuit dies 50A face the conductive pads 120B, and backsides of the integrated circuit dies 50A face away from the conductive pads 120B.

In some embodiments, the integrated circuit dies 50A are bonded to the conductive pads 120B of the metallization pattern 120 in a hybrid bonding configuration. For example, a dielectric layer 68 of the integrated circuit dies 50A may be directly bonded to the dielectric layer 118 of the front-side redistribution structure 124, and die connectors 66 of the integrated circuit dies 50A may be directly bonded to the conductive pads 120B. In an embodiment, the bond between the dielectric layer 68 and the dielectric layer 118 may be an oxide-to-oxide bond, or the like. The hybrid bonding process further directly bonds the die connectors 66 of the integrated circuit dies 50A to the conductive pads 120B through direct metal-to-metal bonding. Thus, electrical connection between the integrated circuit dies 50A and the front-side redistribution structure 124 is provided by the physical connection of the die connectors 66 to the conductive pads 120B.

As an example, the hybrid bonding process may start by applying a surface treatment to the dielectric layer 118 of the front-side redistribution structure 124 and/or the dielectric layer 68 of the integrated circuit dies 50A. The surface treatment may include a plasma treatment. The plasma treatment may be performed in a vacuum environment. After the plasma treatment, the surface treatment may further include a cleaning process (e.g., a rinse with deionized water or the like) that may be applied to the dielectric layer 118 and/or the dielectric layer 68 of the integrated circuit dies 50A. The hybrid bonding process may then proceed to aligning the die connectors 66 to the conductive pads 120B. Next, the hybrid bonding includes a pre-bonding step, during which the die connectors 66 are brought into physical contact with the conductive pads 120B. The pre-bonding may be performed at room temperature (e.g., between about 21° C. and about 25° C.). The hybrid bonding process continues with performing an anneal at a temperature ranging from about 150° C. to about 400° C. for a duration ranging from about 0.5 hours to about 3 hours. The anneal causes the metal of the die connectors 66 (e.g., copper) and the metal of the conductive pads 120B (e.g., copper) to inter-diffuse with each other, forming the direct metal-to-metal bonding. The anneal may further form covalent bonds between the dielectric layer 68 and the dielectric layer 118. In some embodiments, other bonding parameters and/or methods (e.g., solder bonding) may be used.

After the integrated circuit dies 50A are bonded to the front-side redistribution structure 124, the insulation layer 132 and the encapsulant 134 may be formed over the through vias 126, the integrated circuit dies 50A, and the front-side redistribution structure. The insulation layer 132 may be formed of materials and in a manner the same as or similar to those discussed above with respect to FIG. 7. Similarly, the encapsulant 134 may be formed of materials and in a manner the same as or similar to those discussed above with respect to FIG. 7.

FIG. 15 illustrates the structure of FIG. 14 after the processes discussed above with respect to FIG. 8 through 13 are performed. Directly bonding the integrated circuit dies 50A to the front-side redistribution structure 124 simplifies the process for bonding the integrated circuit dies 50A to the front-side redistribution structure 124, eliminates the steps required to form the underfill 130, and reduces the height of the final structure. Moreover, including the insulation layer 132 disposed between the encapsulant 134 and each of the through vias 126, the integrated circuit dies 50A, and the metallization pattern 120 allows for a greater variety of materials to be used for the encapsulant 134. For example, the insulation layer 132 provides electrical isolation, such that electrically conductive materials may be used for the encapsulant 134. Further, the insulation layer 132 may provide a physical buffer layer, such that materials having high thermal expansion coefficients may be used for the encapsulant 134. This allows for materials having high thermal conductivity to be used for the encapsulant 134, which increases heat dissipation through the encapsulant 134. This improves device performance and reduces device defects.

Figure 16:
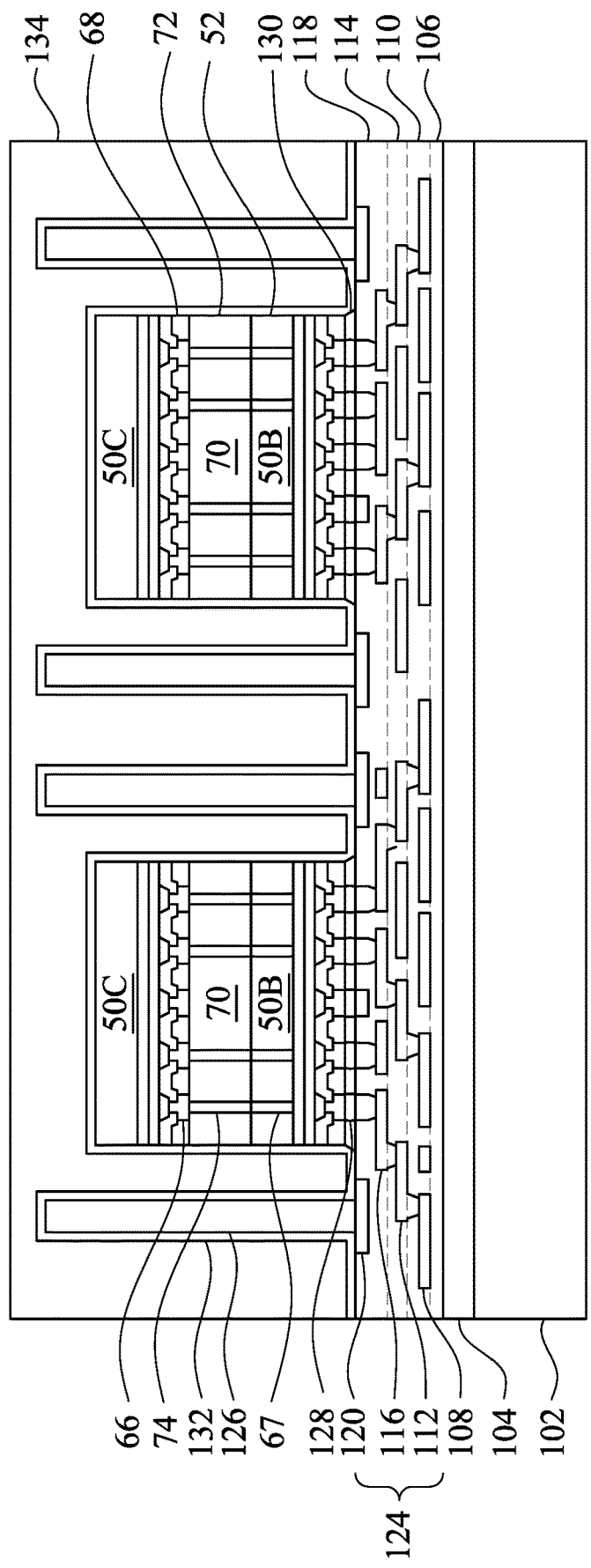
Figure 17:
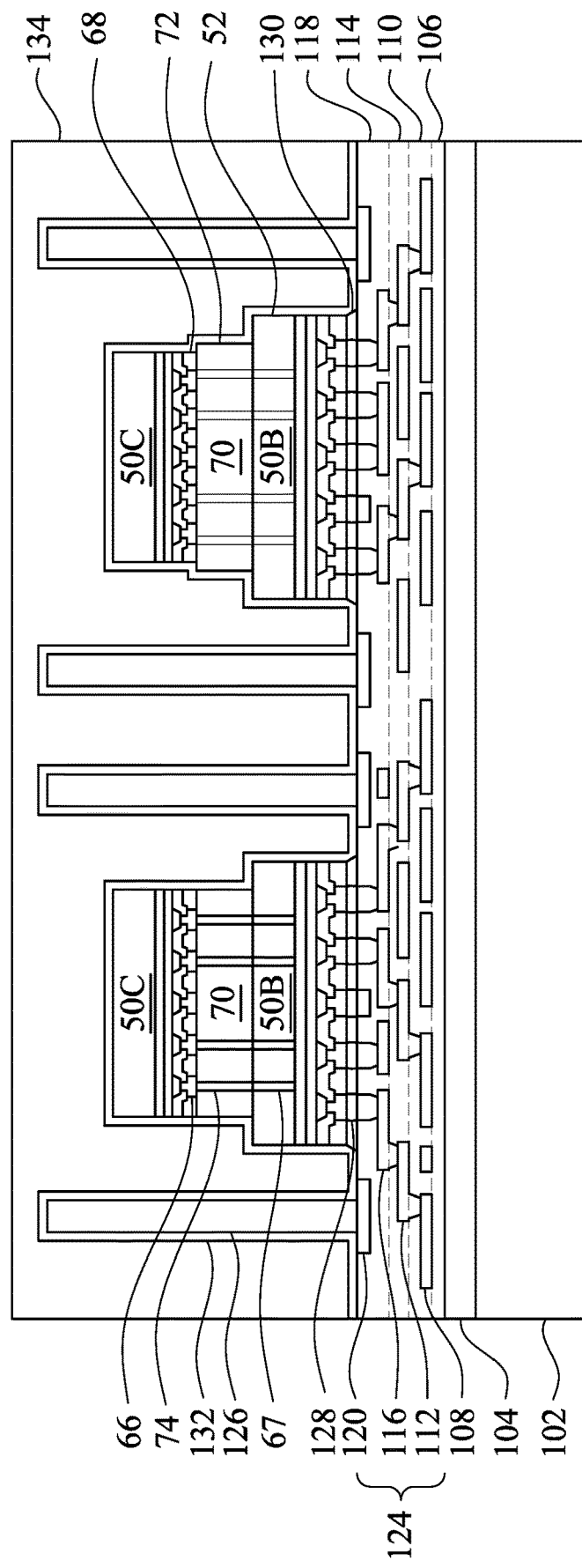
Figure 18:
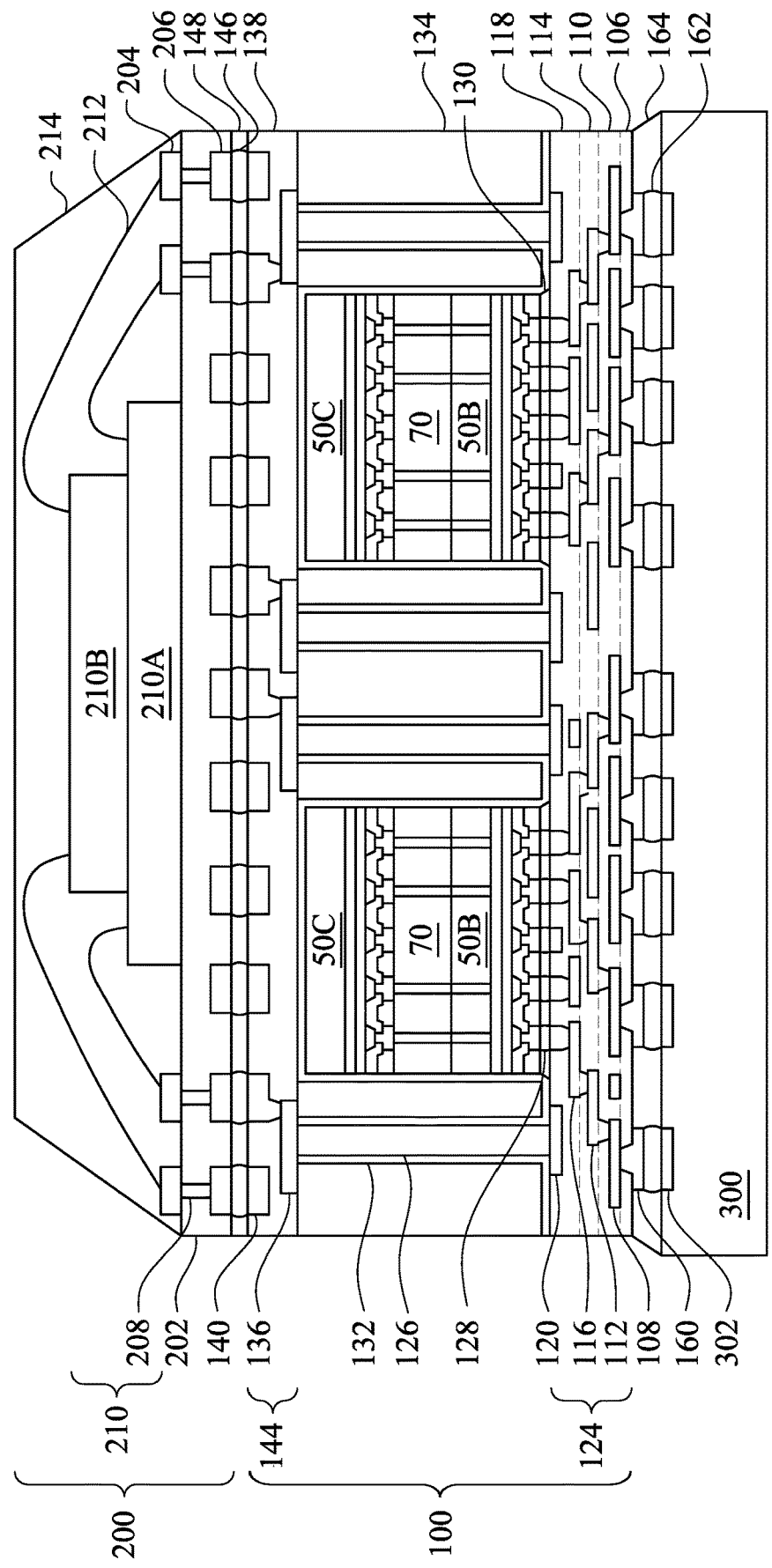

FIGS. 16 through 18 illustrate an embodiment in which multiple integrated circuit dies 50B and 50C along with interconnection dies 70 are bonded to the front-side redistribution structure 124. In FIGS. 16 and 17 the integrated circuit dies 50B and 50C and the interconnection dies 70 are bonded to the front-side redistribution structure 124 illustrated in FIG. 4 and an insulation layer 132 and an encapsulant 134 are formed over the resulting structure. The integrated circuit dies 50B and 50C may be the same as or similar to the integrated circuit dies 50, discussed above. The integrated circuit dies 50B and 50C are disposed face down such that front sides of the integrated circuit dies 50B and 50C face the conductive pads 120B, and backsides of the integrated circuit dies 50B and 50C face away from the conductive pads 120B. Further, the integrated circuit dies 50B may include through-substrate vias (TSVs) 67 (also referred to as through-silicon vias) that extend through the semiconductor substrate 52 of the integrated circuit dies 50B.

The interconnection dies 70 may be local silicon interconnects (LSIs), large-scale integration packages, interposer dies, or the like. The interconnection dies 70 include substrates 72, with conductive features formed in and/or on the substrates 72. The substrates 72 may be semiconductor substrates, dielectric layers, or the like. The interconnection dies 70 may include through-substrate vias (TSVs) 74 (also referred to as through-silicon vias), which extend into or through the substrate 72. In the embodiment illustrated in FIGS. 16 through 18, the TSVs 74 extend through the substrate 72 and are exposed at both front-sides and backsides of the interconnection dies 70.

The integrated circuit dies 50B may be bonded to the front-side redistribution structure 124 through conductive connectors 128 and an underfill 130, through processes similar to or the same as those discussed above with respect to FIGS. 5 and 6. The interconnection dies 70 may be bonded to the integrated circuit dies 50B and the integrated circuit dies 50C may be bonded to the interconnection dies 70 by hybrid bonding processes the same as or similar to those discussed above with respect to FIG. 14. Specifically, the TSVs 74 of the interconnection dies 70 may be bonded to the TSVs 67 of the integrated circuit dies 50B through metal-to-metal bonding; the substrates 72 of the interconnection dies 70 may be bonded to the semiconductor substrates 52 of the integrated circuit dies 50B through oxide-to-oxide bonding; the die connectors 66 of the integrated circuit dies 50C may be bonded to the TSVs 74 of the interconnection dies 70 through metal-to-metal; and the dielectric layers 68 of the integrated circuit dies 50C may be bonded to the substrates 72 of the interconnection dies 70 through oxide-to-oxide bonding. FIG. 16 illustrates an embodiment in which each of the integrated circuit dies 50B and 50C and the interconnection dies 70 have the same widths. FIG. 17 illustrates an embodiment in which the interconnection dies 70 may have widths less than the integrated circuit dies 50B and the integrated circuit dies 50C may have widths equal to or less than the interconnection dies 70. More generally, the width of the each of the dies stacked over the front-side redistribution structure 124 may be equal to or less than the width of an underlying die on which the die is stacked. Although three dies are illustrated in each stack in FIGS. 16 and 17, any number of the interconnection dies 70 and the integrated circuit dies 50B and 50C may be included.

After the integrated circuit dies 50B and 50C and the interconnection dies 70 are bonded to the front-side redistribution structure 124, the insulation layer 132 and the encapsulant 134 may be formed over the through vias 126, the integrated circuit dies 50B and 50C, the interconnection dies 70, and the front-side redistribution structure 124. The insulation layer 132 may be formed of materials and in a manner the same as or similar to those discussed above with respect to FIG. 7. Similarly, the encapsulant 134 may be formed of materials and in a manner the same as or similar to those discussed above with respect to FIG. 7.

FIG. 18 illustrates the structure of FIG. 16 after the processes discussed above with respect to FIG. 8 through 13 are performed. Including the insulation layer 132 disposed between the encapsulant 134 and each of the through vias 126, the integrated circuit dies 50B and 50C, the interconnection dies 70, and the metallization pattern 120 allows for a greater variety of materials to be used for the encapsulant 134. For example, the insulation layer 132 provides electrical isolation, such that electrically conductive materials may be used for the encapsulant 134. Further, the insulation layer 132 may provide a physical buffer layer, such that materials having high thermal expansion coefficients may be used for the encapsulant 134. This allows for materials having high thermal conductivity to be used for the encapsulant 134, which increases heat dissipation through the encapsulant 134. This improves device performance and reduces device defects. Moreover, providing stacked dies surrounded by the encapsulant 134 improves heat dissipation from all of the encapsulated dies, and provides for improved functionality of the packaged structure.

Figure 19:
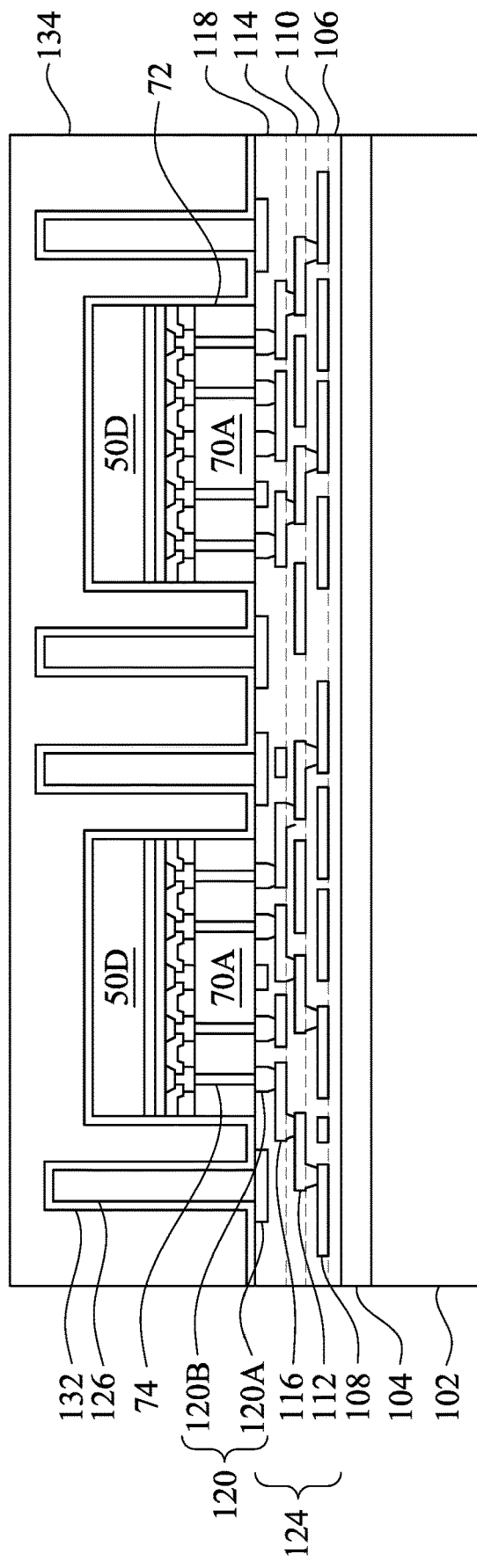
Figure 20:
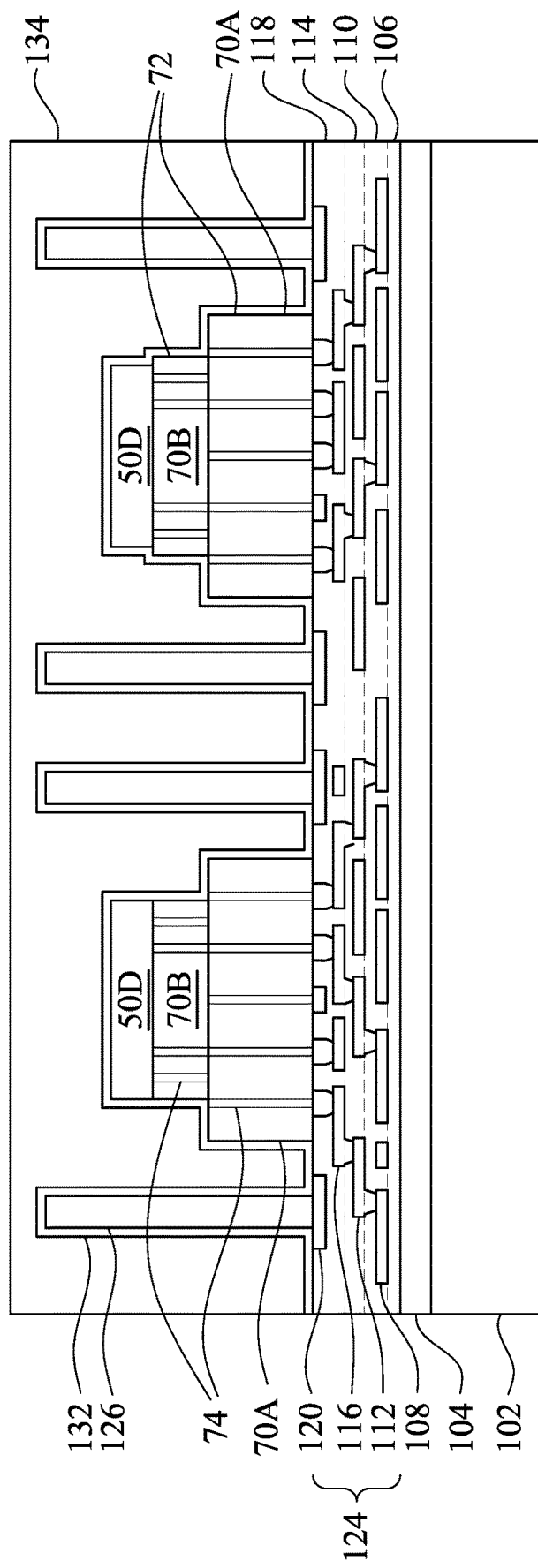
Figure 21:
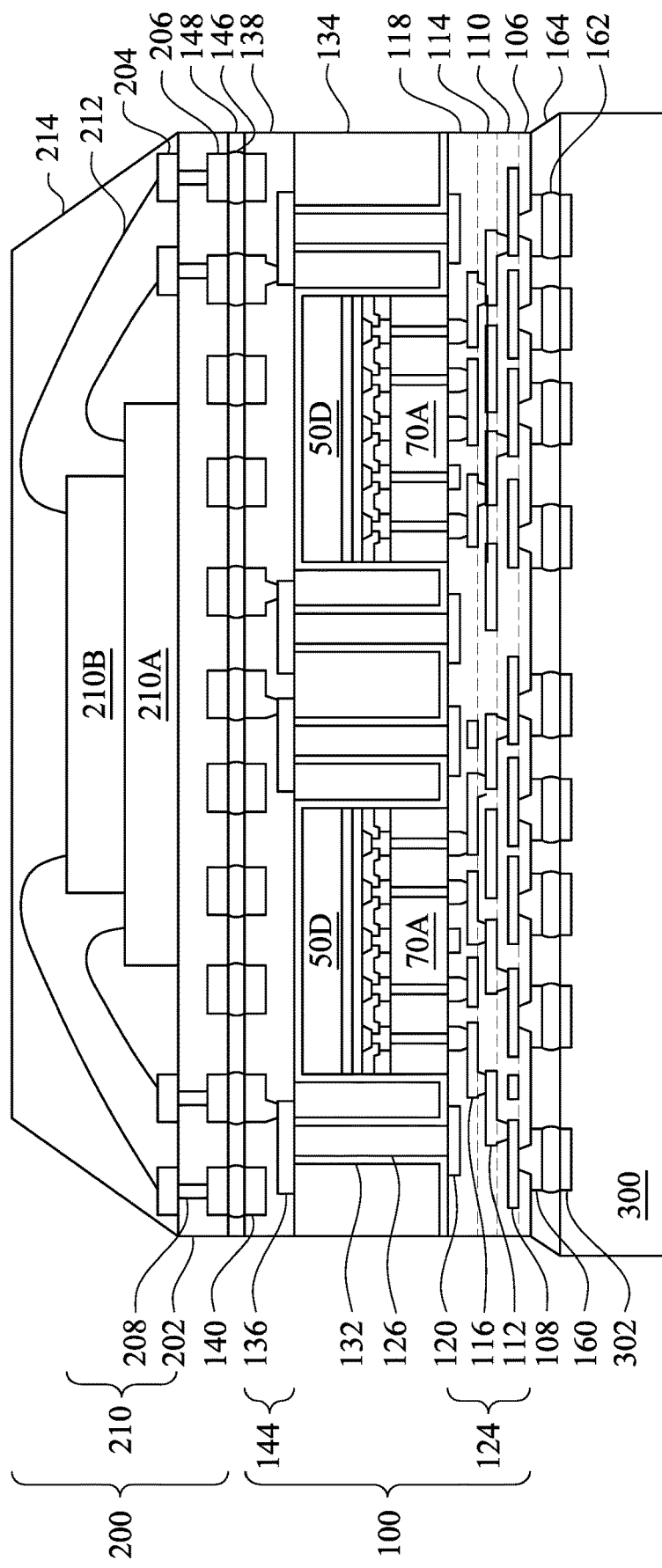

FIGS. 19 through 21 illustrate an embodiment in which interconnection dies 70A are directly bonded to the front-side redistribution structure 124 and integrated circuit dies 50D are directly bonded to the interconnection dies 70A or are directly bonded to interconnection dies 70B, which are directly bonded to the interconnection dies 70A. In FIG. 19 the integrated circuit dies 50D are bonded to the interconnection dies 70A, and the stacks including the integrated circuit dies 50D and the interconnection dies 70A are bonded to the front-side redistribution structure 124 illustrated in FIG. 4. An insulation layer 132 and an encapsulant 134 are formed over the resulting structure. In FIG. 20 the integrated circuit dies 50D are bonded to the interconnection dies 70B, the interconnection dies 70B are bonded to the interconnection dies 70A, and the stacks including the integrated circuit dies 50D, the interconnection dies 70B, and the interconnection dies 70A are bonded to the front-side redistribution structure 124 illustrated in FIG. 4. An insulation layer 132 and an encapsulant 134 are formed over the resulting structure. The integrated circuit dies 50D may be the same as or similar to the integrated circuit dies 50, discussed above. The integrated circuit dies 50B and 50C are disposed face down such that front sides of the integrated circuit dies 50B and 50C face the conductive pads 120B, and backsides of the integrated circuit dies 50B and 50C face away from the conductive pads 120B. The interconnection dies 70A and 70B may be the same as or similar to the interconnection dies 70, discussed above.

The interconnection dies 70A may be bonded to the front-side redistribution structure 124 by hybrid bonding processes the same as or similar to those discussed above with respect to FIG. 14. Specifically, the TSVs 74 of the interconnection dies 70A may be bonded to the conductive pads 120B of the front-side redistribution structure 124 through metal-to-metal bonding and the substrates 72 of the interconnection dies 70A may be bonded to the dielectric layer 118 of the front-side redistribution structure 124 through oxide-to-oxide bonding. The interconnection dies 70B may be bonded to the interconnection dies 70A by hybrid bonding processes the same as or similar to those discussed above with respect to FIG. 14. Specifically, the TSVs 74 of the interconnection dies 70B may be bonded to the TSVs 74 of the interconnection dies 70A through metal-to-metal bonding and the substrates 72 of the interconnection dies 70B may be bonded to the substrates 72 of the interconnection dies 70A through oxide-to-oxide bonding. The integrated circuit dies 50D may be bonded to the interconnection dies 70A or 70B by hybrid bonding processes the same as or similar to those discussed above with respect to FIG. 14. Specifically, the die connectors 66 of the integrated circuit dies 50D may be bonded to the TSVs 74 of the interconnection dies 70A or 70B through metal-to-metal bonding and the dielectric layers 68 of the integrated circuit dies 50D may be bonded to the substrates 72 of the interconnection dies 70A or 70B through oxide-to-oxide bonding.

FIG. 19 illustrates an embodiment in which each of the integrated circuit dies 50D and the interconnection dies 70A have the same widths, and each of the integrated circuit dies 50D is bonded to the front-side redistribution structure 124 through a single interconnection die 70A. FIG. 20 illustrates an embodiment in which the interconnection dies 70B may have widths less than the interconnection dies 70A and the integrated circuit dies 50D may have widths equal to or less than the interconnection dies 70B. More generally, the width of the each of the dies stacked over the front-side redistribution structure 124 may be equal to or less than the width of an underlying die on which the die is stacked. Further in FIG. 20, each of the integrated circuit dies 50D is bonded to the front-side redistribution structure 124 through an interconnection die 70B and an interconnection die 70A. Although two dies are illustrated in each stack in FIG. 19 and three dies are illustrated in each stack in FIG. 20, any number of the interconnection dies 70A, the interconnection dies 70B, and the integrated circuit dies 50D may be included.

After the integrated circuit dies 50D and the interconnection dies 70A and 70B are bonded to the front-side redistribution structure 124, the insulation layer 132 and the encapsulant 134 may be formed over the through vias 126, the integrated circuit dies 50D, the interconnection dies 70A and 70B, and the front-side redistribution structure 124. The insulation layer 132 may be formed of materials and in a manner the same as or similar to those discussed above with respect to FIG. 7. Similarly, the encapsulant 134 may be formed of materials and in a manner the same as or similar to those discussed above with respect to FIG. 7.

FIG. 21 illustrates the structure of FIG. 19 after the processes discussed above with respect to FIG. 8 through 13 are performed. Including the insulation layer 132 disposed between the encapsulant 134 and each of the through vias 126, the integrated circuit dies 50D, the interconnection dies 70A and 70B, and the metallization pattern 120 allows for a greater variety of materials to be used for the encapsulant 134. For example, the insulation layer 132 provides electrical isolation, such that electrically conductive materials may be used for the encapsulant 134. Further, the insulation layer 132 may provide a physical buffer layer, such that materials having high thermal expansion coefficients may be used for the encapsulant 134. This allows for materials having high thermal conductivity to be used for the encapsulant 134, which increases heat dissipation through the encapsulant 134. This improves device performance and reduces device defects. Moreover, providing stacked dies surrounded by the encapsulant 134 improves heat dissipation from all of the encapsulated dies, and provides for improved functionality of the packaged structure.

Figure 22:
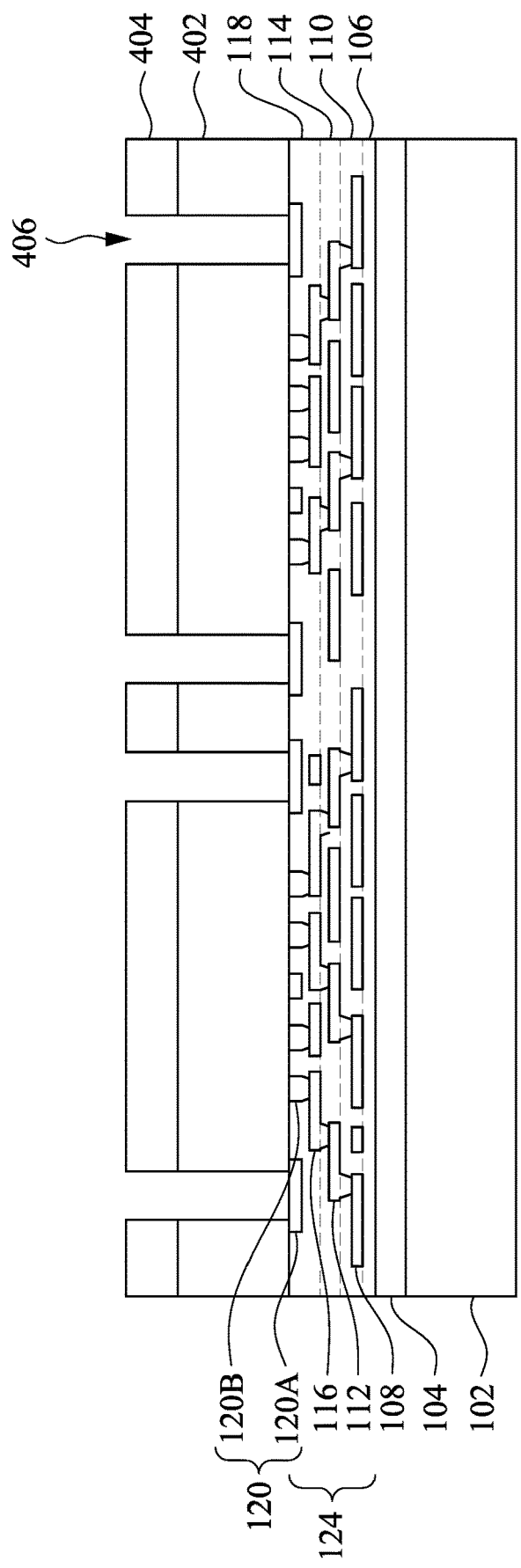

FIGS. 22 through 25 illustrate an embodiment in which an insulation layer 408 (illustrated in FIGS. 23 through 25) is formed along sidewalls of the through vias 126, without being formed over the remainder of the front-side redistribution structure 125 or the integrated circuit dies 50. In FIG. 22, a mask layer 402 and a photoresist 404 are formed over the front-side redistribution structure 124 illustrated in FIG. 3. The mask layer 402 may include, for example, silicon nitride, silicon oxynitride, or the like. In some embodiments, the mask layer 402 may be a polymer layer. The mask layer 402 may be formed, for example, by spin coating, lamination, CVD, ALD, or the like. The photoresist 404 is formed over the mask layer 402. The photoresist 404 may be formed by depositing a photosensitive layer over the mask layer 402 using spin-on coating or the like.

The photoresist 404 and the mask layer 402 may then be patterned. The photoresist 404 may be patterned by exposing the photoresist 404 to a patterned energy source (e.g., a patterned light source) and developing the photoresist 404 to remove an exposed or unexposed portion of the photoresist 404. Openings 406 exposing the mask layer 402 are formed extending through the photoresist 404. The mask layer 402 may be etched using the photoresist 404 as a mask using any acceptable etch process, such as a reactive ion etch (RIE), neutral beam etch (NBE), the like, or a combination thereof. The mask layer 402 may be etched by an anisotropic etch process.

Figure 23:
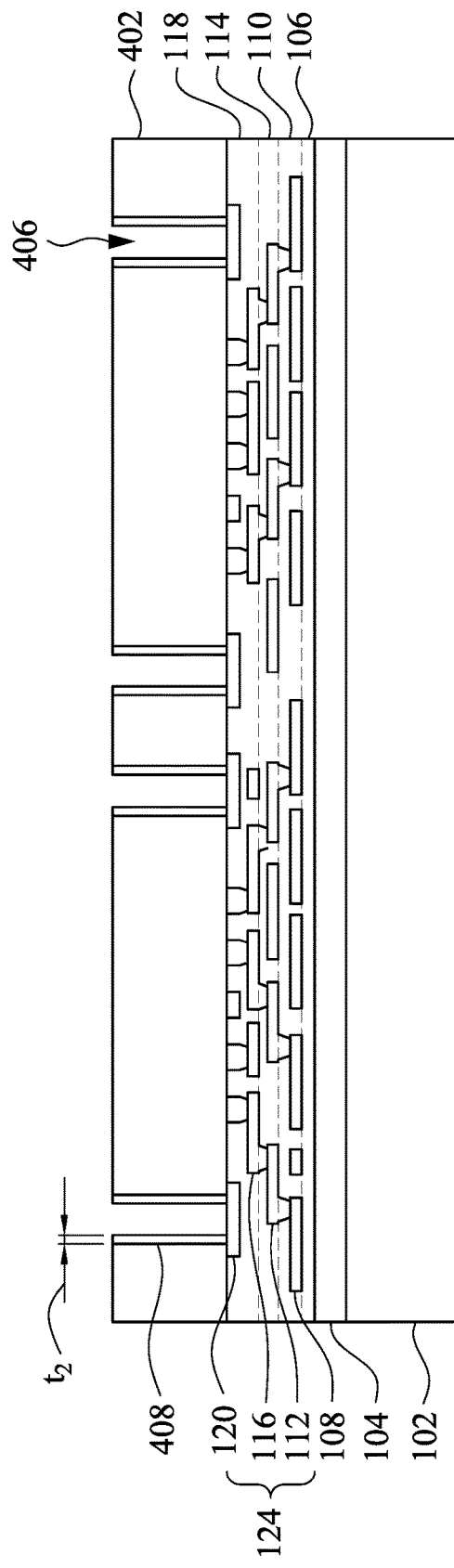

In FIG. 23, the photoresist 404 is removed and an insulation layer 408 is formed along sidewalls of the mask layer 402 in the openings 406. The photoresist 404 may be removed by an acceptable ashing or stripping process, such as using an oxygen plasma or the like. The insulation layer 408 may be formed of materials and deposited in a manner the same as or similar to the insulation layer 132. After the insulation layer 408 is deposited, the insulation layer 408 may be etched to expose the conductive pads 120A of the front-side redistribution structure 124. The insulation layer 408 may have a thickness $t_2$ ranging from about 10 nm to about wo nm. Forming the insulation layer 408 to a thickness less than the prescribed range may cause difficulties in the formation of the insulation layer 408 and may be insufficient for providing the benefits of the insulation layer 408 (e.g., providing electrical isolation for subsequently formed vias, such as vias 126, discussed below with respect to FIG. 24). Further, the insulation layer 408 may be formed of a material having a lower thermal conductivity than the material of a subsequently formed encapsulant (such as the encapsulant 134, discussed below with respect to FIG. 25). Forming the insulation layer 408 to a thickness greater than the prescribed range lowers the combined thermal conductivity of the insulation layer 408 and the encapsulant 134.

Figure 24:
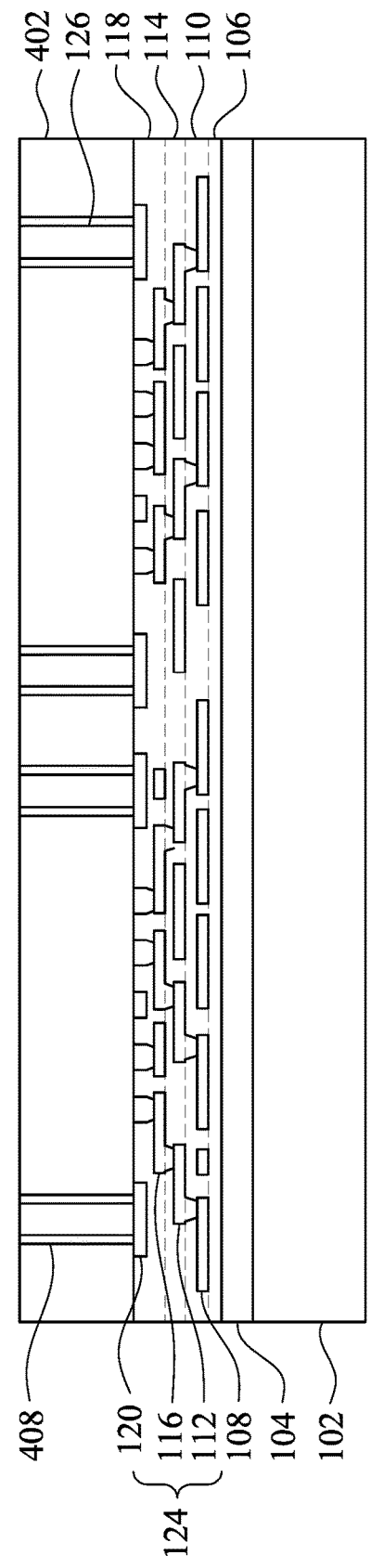

In FIG. 24, vias 126 are formed on the conductive pads 120A of the metallization pattern 120 and filling the openings 406. The vias 126 may extend away from the topmost dielectric layer of the front-side redistribution structure 124 (e.g., the dielectric layer 118) and may extend between portions of the insulation layer 408 formed on opposite sidewalls of each of the openings 406. As an example to form the vias 126, a seed layer (not separately illustrated) is formed in the openings 406 over the conductive pads 120A and the insulation layer 408 and over the mask layer 402. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. In some embodiments, such as embodiments where the vias 126 are the same width as or narrower than the underlying conductive pads 120A, a separate seed layer may be omitted, and the conductive pads 120A may act as the seed layer. A conductive material is then formed over the seed layer and filling the openings 406. The conductive material may be formed by plating, such as electroplating or electroless plating, or the like. The conductive material may comprise a metal, like copper, titanium, tungsten, aluminum, or the like. After the conductive material is formed, a planarization process may be performed on the conductive material and the seed layer. The planarization process may be a CMP, a grinding process, or the like. The remaining portions of the seed layer and the conductive material form the vias 126. Top surfaces of the vias 126, the insulation layer 408, and the mask layer 402 may be level with one another following the planarization process (e.g., within process variations).

Figure 25:
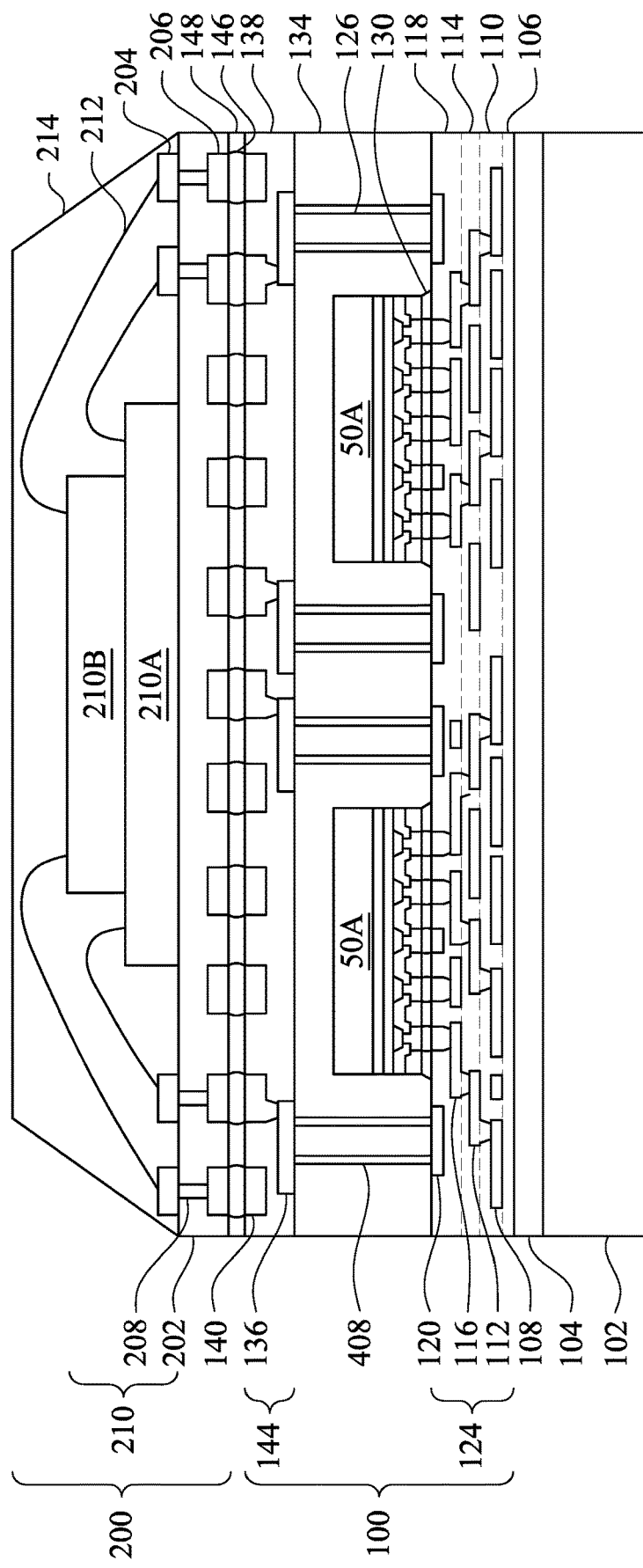

In FIG. 25, the mask layer 402 is removed and the processes discussed above with respect to FIG. 5 through 13 are performed (with the processes used to form the insulation layer 132 being omitted). The mask layer 402 may be removed by an etching process, such as an isotropic or an anisotropic etching process, or the like. Including the insulation layer 408 disposed between the encapsulant 134 and the through vias 126 allows for a greater variety of materials to be used for the encapsulant 134. For example, the insulation layer 408 provides electrical isolation, such that electrically conductive materials may be used for the encapsulant 134. Further, the insulation layer 408 may provide a physical buffer layer, such that materials having high thermal expansion coefficients may be used for the encapsulant 134. This allows for materials having high thermal conductivity to be used for the encapsulant 134, which increases heat dissipation through the encapsulant 134. This improves device performance and reduces device defects. Moreover, forming the insulation layer 408 only along sidewalls of the through vias 126 improves precision of the deposition of the insulation layer 408, and reduces the material used for the insulation layer 408. However, forming the insulation layer 408 only along sidewalls of the through vias 126 may also increase costs compared to embodiments in which the insulation layer 132 is formed.

Embodiments may achieve various advantages. For example, forming the insulation layer over underlying vias, redistribution structures, and integrated circuit dies enables a wider range of materials to be used for the encapsulant formed over the insulation layer. The insulation layer may provide electrical insulation and a physical buffer between the encapsulant and the underlying structures, which enables the encapsulant to be formed of electrically conductive materials and materials having higher thermal expansion coefficients, respectively. This allows materials having higher thermal conductivities to be used for the encapsulant, which improves heat dissipation through the encapsulant, and improves device performance and reduces device defects.

In accordance with an embodiment, a semiconductor device includes a first redistribution structure; a first die over and electrically coupled to the first redistribution structure; a first through via over and electrically coupled to the first redistribution structure; an insulation layer extending along the first redistribution structure, the first die, and the first through via; and an encapsulant over the insulation layer, the encapsulant surrounding portions of the first through via and the first die, the encapsulant including conductive fillers at a concentration ranging from 70% to about 95% by volume. In an embodiment, the encapsulant has a thermal conductivity of greater than 40 W/m·K. In an embodiment, a top surface of the encapsulant is level with a top surface of the first through via and top surfaces of the insulation layer, and the top surface of the encapsulant is above a top surface of the first die. In an embodiment, the insulation layer extends along sidewalls of the first through via, a top surface of the first redistribution structure, and a top surface and sidewalls of the first die. In an embodiment, the first die is bonded to the first redistribution structure by oxide-to-oxide bonds and metal-to-metal bonds. In an embodiment, the first die is bonded to the first redistribution structure through conductive connectors, the semiconductor device further includes a first underfill surrounding the conductive connectors, and the insulation layer extends along sidewalls of the first underfill. In an embodiment, the insulation layer has a thickness ranging from 10 nm to 100 nm, and the encapsulant has a thermal conductivity ranging from 40 W/m·K to 100 W/m·K.

In accordance with another embodiment, a semiconductor device includes a first integrated circuit die; a front-side redistribution structure on a front-side of the first integrated circuit die; a backside redistribution structure on a backside of the first integrated circuit die; a molding compound encapsulating the first integrated circuit die between the front-side redistribution structure and the backside redistribution structure, the molding compound having a thermal conductivity of greater than 40 W/m·K; a through via extending through the molding compound, the through via being electrically coupled to the front-side redistribution structure and the backside redistribution structure; and an insulation layer covering sidewalls of the through via, the insulation layer separating the through via from the molding compound. In an embodiment, the molding compound includes conductive particles selected from copper (Cu), silicon (Si), silver (Ag), gold (Au), iron (Fe), and tungsten (W), and the molding compound includes the conductive particles at a concentration ranging from 70% to 95% by volume. In an embodiment, the molding compound has a thermal conductivity ranging from 40 W/m·K to wo W/m·K, and the insulation layer has a thermal conductivity less than the thermal conductivity of the molding compound. In an embodiment, the insulation layer includes at least one of aluminum nitride (AlN), boron nitride (BN), beryllium oxide (BeO), diamond, or aluminum oxide ($Al_2O_3$). In an embodiment, the semiconductor device further includes an interconnection die bonded to the first integrated circuit die by metal-to-metal bonds and oxide-to-oxide bonds. In an embodiment, the molding compound physically contacts the front-side redistribution structure, the backside redistribution structure, and the first integrated circuit die. In an embodiment, the insulation layer covers a top surface of the front-side redistribution structure and a backside and sidewalls of the first integrated circuit die, and the insulation layer separates the front-side redistribution structure and the first integrated circuit die from the molding compound.

In accordance with yet another embodiment, a method includes forming a via over a redistribution structure; bonding a semiconductor die to the redistribution structure adjacent the via; depositing an insulation layer over the via, the redistribution structure, and the semiconductor die, the insulation layer electrically isolating the through via, the redistribution structure, and the semiconductor die from one another; and preparing a molding compound by mixing an epoxy and conductive fillers, the conductive fillers making up 70% to 95% of the molding compound by volume; depositing the molding compound over the insulation layer, the molding compound being configured to conduct heat from the semiconductor die. In an embodiment, the insulation layer is deposited by a conformal deposition process. In an embodiment, the method further includes planarizing the molding compound and the insulation layer to expose the via. In an embodiment, bonding the semiconductor die to the redistribution structure includes reflowing conductive connectors between semiconductor die and the redistribution structure; and forming an underfill material surrounding the conductive connectors, the insulation layer being deposited on sidewalls of the underfill material. In an embodiment, bonding the semiconductor die to the redistribution structure includes forming oxide-to-oxide bonds and metal-to-metal bonds between the semiconductor die and the redistribution structure. In an embodiment, bonding the semiconductor die to the redistribution structure includes bonding a die stack to the redistribution structure, the die stack including the semiconductor die and an interconnection die, the insulation layer being further deposited on the interconnection die.

Certain embodiments disclosed herein provide for a semiconductor device including a first redistribution structure. The semiconductor device also includes a first die electrically coupled to the first redistribution structure. The device also includes a continuous insulation layer extending over the first redistribution structure and the first die. The device also includes an encapsulant may include conductive fillers and extending over the continuous insulation layer, the encapsulant surrounding portions of the first die. The device also includes a conductive via extending through the encapsulant, sidewalls of the conductive via being surrounded by the continuous insulating layer, where a top surface of the encapsulant is level with a top surface of the conductive via and a top surface of the continuous insulation layer.

Certain other embodiments disclosed herein provide for semiconductor device having a first redistribution structure. The semiconductor device also includes a first integrated circuit die on and electrically connected to the first redistribution structure. The device also includes a molding compound at least partially encapsulating the first integrated circuit die, the molding compound may include conductive fillers. The device also includes a through via extending through the molding compound and electrically contacting the redistribution structure. The device also includes an insulation layer covering sidewalls of the through via, where the insulation layer electrically insulates the through via from the molding compound, and further where the insulation layer electrically insulates the first redistribution structure and the first integrated circuit die from the molding compound.

Certain additional embodiments disclosed herein provide for a method including forming a conductive via on a redistribution structure. The method also includes bonding a semiconductor die to the redistribution structure. The method also includes at least partially surrounding the conductive via and the semiconductor die with an insulation layer. The method also includes depositing over the insulating layer, a molding compound may include conductive fillers the molding compound being configured to conduct heat from the semiconductor die, and the insulating layer being configured to electrically insulate the conductive via and the semiconductor die from the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first redistribution structure;
   a first die electrically coupled to the first redistribution structure;
   a continuous insulation layer extending over the first redistribution structure and the first die;
   an encapsulant comprising conductive fillers and extending over the continuous insulation layer, the encapsulant surrounding portions of the first die; and
   a conductive via extending through the encapsulant, sidewalls of the conductive via being surrounded by the continuous insulating layer, wherein a top surface of the encapsulant is level with a top surface of the conductive via and a top surface of the continuous insulation layer.

2. The semiconductor device of claim 1, wherein the encapsulant comprises conductive fillers at a concentration ranging from 70% to about 95% by volume.

3. The semiconductor device of claim 1, wherein the continuous insulation layer insulates the redistribution structure and the first die from the encapsulant.

4. The semiconductor device of claim 1, wherein the encapsulant comprises conductive particles selected from copper (Cu), silicon (Si), silver (Ag), gold (Au), iron (Fe), and tungsten (W), and wherein the encapsulant comprises the conductive particles at a concentration ranging from 70% to 95% by volume.

5. The semiconductor device of claim 1, wherein the encapsulant has a thermal conductivity ranging from 40 W/m·K to 100 W/m·K.

6. The semiconductor device of claim 5, wherein the continuous insulation layer has a thermal conductivity less than the thermal conductivity of the encapsulant.

7. The semiconductor device of claim 1, wherein the continuous insulation layer comprises a material selected from the group consisting of aluminum nitride (AlN), boron nitride (BN), beryllium oxide (BeO), diamond, and aluminum oxide ($Al_2O_3$).

8. The semiconductor device of claim 1, wherein the encapsulant physically contacts the first redistribution structure and the first die.

9. A semiconductor device comprising:
a first redistribution structure;
a first integrated circuit die on and electrically connected to the first redistribution structure;
a molding compound at least partially encapsulating the first integrated circuit die, the molding compound comprising conductive fillers;
a through via extending through the molding compound and electrically contacting the redistribution structure; and
an insulation layer covering sidewalls of the through via, wherein the insulation layer electrically insulates the through via from the molding compound, and further wherein the insulation layer electrically insulates the first redistribution structure and the first integrated circuit die from the molding compound.

10. The semiconductor device of claim 9, further comprising a second redistribution structure on and electrically connected to the first integrated circuit die opposite to the first redistribution structure.

11. The semiconductor device of claim 10, wherein the molding compound physically contacts the second redistribution structure.

12. The semiconductor device of claim 9, wherein the molding compound comprises conductive particles selected from copper (Cu), silicon (Si), silver (Ag), gold (Au), iron (Fe), and tungsten (W).

13. The semiconductor device of claim 12, wherein the molding compound comprises the conductive particles at a concentration ranging from 70% to 95% by volume.

14. The semiconductor device of claim 9, wherein the molding compound has a thermal conductivity ranging from 40 W/m·K to 100 W/m·K, and wherein the insulation layer has a thermal conductivity less than the thermal conductivity of the molding compound.

15. The semiconductor device of claim 9, wherein the insulation layer comprises a material selected from the group consisting of aluminum nitride (AlN), boron nitride (BN), beryllium oxide (BeO), diamond, or aluminum oxide ($Al_2O_3$).

16. The semiconductor device of claim 9, wherein the first integrated circuit die is bonded to the first redistribution structure through conductive connectors, and further comprising an underfill surrounding the conductive connectors.

17. The semiconductor device of claim 16, wherein the insulation layer extends along sidewalls of the underfill.

18. A method comprising:
forming a conductive via on and electrically connected to a redistribution structure;
bonding a semiconductor die to the redistribution structure;
at least partially surrounding the conductive via and the semiconductor die with an insulation layer; and
depositing over the insulating layer, a molding compound comprising conductive fillers the molding compound being configured to conduct heat from the semiconductor die, and the insulating layer being configured to electrically insulate the conductive via and the semiconductor die from the molding compound.

19. The method of claim 18, wherein the step of forming a conductive via on a redistribution structure includes:
forming a patterned seed layer on the redistribution structure; and
plating metal pillars onto the patterned seed layer.

20. The method of claim 18, further comprising depositing the insulating layer using a process selected from the group consisting of CVD, plasma-enhanced CVD (PECVD), atomic layer deposition (ALD), plasma-enhanced ALD (PEALD), PVD, sputtering, spin coating, and thermal spraying.

* * * * *